(12) United States Patent
Yao et al.

(10) Patent No.: US 10,867,687 B2
(45) Date of Patent: Dec. 15, 2020

(54) SHIFT REGISTER UNIT AND METHOD FOR DRIVING THE SAME, GATE DRIVE CIRCUITRY AND DISPLAY DEVICE

(71) Applicant: BOE TECHNOLOGY GROUP CO., LTD., Beijing (CN)

(72) Inventors: Xing Yao, Beijing (CN); Mingfu Han, Beijing (CN); Guangliang Shang, Beijing (CN); Haoliang Zheng, Beijing (CN); Lijun Yuan, Beijing (CN); Zhenyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/697,889

(22) Filed: Nov. 27, 2019

(65) Prior Publication Data

US 2020/0219576 A1     Jul. 9, 2020

(30) Foreign Application Priority Data

Jan. 4, 2019    (CN) .......................... 2019 1 0010318

(51) Int. Cl.
| | | |
|---|---|---|
| *G09G 3/36* | (2006.01) | |
| *G11C 19/00* | (2006.01) | |
| *G11C 19/18* | (2006.01) | |
| *G11C 19/28* | (2006.01) | |
| *G09G 3/20* | (2006.01) | |

(52) U.S. Cl.
CPC ............. *G11C 19/184* (2013.01); *G09G 3/20* (2013.01); *G11C 19/28* (2013.01); *G09G 2300/0426* (2013.01); *G09G 2310/0286* (2013.01)

(58) Field of Classification Search
CPC ........ G11C 19/184; G11C 19/28; G09G 3/20; G09G 2310/0286; G09G 2300/0426
See application file for complete search history.

(56) References Cited

U.S. PATENT DOCUMENTS

| | | | | |
|---|---|---|---|---|
| 3,794,856 A | * | 2/1974 | Baker ................... | G11C 19/184 377/79 |
| 8,724,771 B2 | * | 5/2014 | Jang ........................ | G11C 19/28 377/64 |
| 8,817,943 B2 | * | 8/2014 | Jang ........................ | G11C 19/28 377/64 |
| 8,860,651 B2 | * | 10/2014 | Tseng ..................... | G11C 19/28 345/100 |

\* cited by examiner

*Primary Examiner* — Kenneth B Wells
(74) *Attorney, Agent, or Firm* — Muncy, Geissler, Olds & Lowe, P.C.

(57) ABSTRACT

A shift register unit and a method for driving the same, a gate drive circuitry and a display device are provided. The shift register unit includes: an output circuit, coupled to a first signal output terminal and a pull-up control node, and configured to receive a first clock signal and output the first clock signal to the first signal output terminal under control of a potential of the pull-up control node; an output control circuit, coupled to a signal input terminal, the pull-up control node and the first signal output terminal; a clock control circuit configured to receive a first clock signal and at least one additional clock signal and generate a second clock signal using the first clock signal and the at least one additional clock signal; and a transmission circuit coupled to a second signal output terminal and the pull-up control node.

20 Claims, 16 Drawing Sheets

SHIFT REGISTER UNIT AND METHOD FOR DRIVING THE SAME, GATE DRIVE CIRCUITRY AND DISPLAY DEVICE

CROSS-REFERENCE TO RELATED APPLICATION

This application claims a priority to Chinese Patent Application No. 201910010318.0 filed on Jan. 4, 2019, the disclosure of which is incorporated in its entirety by reference herein.

TECHNICAL FIELD

The present disclosure relates to the field of displays, and in particular to a shift register unit and a method for driving the same, a gate drive circuitry and a display device.

BACKGROUND

In a Thin Film Transistor TFT-based display, a gate drive circuitry for driving gate electrodes may be formed on a display panel to form an array substrate (referred to as Gate drive On Array, GOA) panel.

SUMMARY

A shift register unit and a method for driving the same, a gate drive circuitry and a display device are provided according to embodiments of the present disclosure.

In a first aspect, a shift register unit is provided according to embodiments of the present disclosure. The shift register unit includes:

an output circuit, coupled to a first signal output terminal and a pull-up control node, where the output circuit is configured to receive a first clock signal, and output the first clock signal to the first signal output terminal under a control of a potential of the pull-up control node;

an output control circuit, coupled to a signal input terminal, the pull-up control node, and the first signal output terminal, where the output control circuit is configured to receive an input signal from the signal input terminal, and control, in response to the input signal, the potential of the pull-up control node and a potential of the first signal output terminal;

a clock control circuit, configured to receive a first clock signal and at least one additional clock signal, and generate a second clock signal using the first clock signal and the at least one additional clock signal; and a transmission circuit, coupled to a second signal output terminal and the pull-up control node, where the transmission circuit is configured to receive the second clock signal, and output the second clock signal to the second signal output terminal under a control of the potential of the pull-up control node, where the clock control circuit is configured in that a period of the second clock signal is the same as a period of the first clock signal, and a pulse width of the second clock signal is larger than a pulse width of the first clock signal.

In some optional embodiments of the present disclosure, the clock control circuit includes: a first transistor group including a first transistor, where a gate electrode of the first transistor is used to receive the first clock signal, a first electrode of the first transistor is coupled to a first voltage terminal, and a second electrode of the first transistor is coupled to the transmission circuit; and a second transistor group including m transistors, where a first electrode of each of the m transistors is coupled to a second voltage terminal, a second electrode of each of the m transistors is coupled to the transmission circuit, and gate electrodes of the m transistors are respectively used to receive the at least one additional clock signal, m being an integer greater than or equal to 1.

In some optional embodiments of the present disclosure, the at least one additional clock signal includes N additional clock signals, N being an integer greater than m; the first transistor group further includes N-m transistors, a first electrode of each of the N-m transistors is coupled to the first voltage terminal, a second electrode of each of the N-m transistors is coupled to the transmission circuit, and gate electrodes of the N-m transistors are respectively used to receive N-m additional clock signals of the N additional clock signals; and the m transistors in the second transistor group are respectively used to receive m additional clock signals of the N additional clock signals except the N-m additional clock signals.

In some optional embodiments of the present disclosure, the output circuit includes a second transistor and a capacitor. A gate electrode of the second transistor is coupled to the pull-up control node, a first electrode of the second transistor is used to receive the first clock signal, and a second electrode of the second transistor is coupled to the first signal output terminal. A first end of the capacitor is coupled to the gate electrode of the second transistor, and the second end is coupled to the first signal output terminal.

In some optional embodiments of the present disclosure, the transmission circuit includes a third transistor. A gate electrode of the third transistor is coupled to the pull-up control node, a first electrode of the third transistor is configured to receive the second clock signal, and a second electrode of the third transistor is coupled to the second signal output terminal.

In some optional embodiments of the present disclosure, the output control circuit includes a fourth transistor. A gate electrode and a first electrode of the fourth transistor are coupled to the signal input terminal, a second electrode of the fourth transistor is coupled to the pull-up control node, and the fourth transistor is configured to transmit an input signal at the signal input terminal to the pull-up control node to charge the pull-up control node.

In some optional embodiments of the present disclosure, the second signal output terminal of a current shift register unit is coupled to a signal input terminal of a subsequent stage of shift register unit; and the transmission circuit of the current shift register unit is configured to transmit the second clock signal at the second signal output terminal to the signal input terminal of the subsequent stage of shift register unit as an input signal of the subsequent stage of shift register unit.

In some optional embodiments of the present disclosure, the output control circuit is further coupled to a reset signal terminal and configured to reset a potential at the pull-up control node, in response to a reset signal received from the reset signal terminal.

In some optional embodiments of the present disclosure, a duration of an active level of the first clock signal and a duration of an active level of the at least one additional clock signal provided to the second transistor group are non-overlapped; and the clock control circuit is configured to generate the second clock signal with a pulse width that is determined by a minimum of a phase difference between the first clock signal and the at least one additional clock signal provided to the second transistor group.

In a second aspect, a gate drive circuitry is provided according to embodiments of the present disclosure, which includes a plurality of clock signal lines, and R stages of shift register units. Each of the R stages of shift register units includes: an output circuit, coupled to a first signal output terminal and a pull-up control node, where the output circuit is configured to receive a first clock signal, and output the first clock signal to the first signal output terminal under a control of a potential of the pull-up control node; an output control circuit, coupled to a signal input terminal, the pull-up control node, and the first signal output terminal, where the output control circuit is configured to receive an input signal from the signal input terminal, and control, in response to the input signal, the potential of the pull-up control node and a potential of the first signal output terminal; a clock control circuit, configured to receive a first clock signal and at least one additional clock signal, and generate a second clock signal using the first clock signal and the at least one additional clock signal; and a transmission circuit, coupled to a second signal output terminal and the pull-up control node, where the transmission circuit is configured to receive the second clock signal, and output the second clock signal to the second signal output terminal under a control of the potential of the pull-up control node. The clock control circuit is configured in such a manner that a period of the second clock signal is the same as a period of the first clock signal, and a pulse width of the second clock signal is larger than a pulse width of the first clock signal. An r-th stage of shift register unit is coupled to N+1 clock signal lines of a first clock signal line to a Q-th clock signal line, R is an integer greater than or equal to Q, r is an integer that is greater than or equal to 1, and less than or equal to R, and Q is the number of the plurality of clock signal lines in the gate drive circuitry, Q being greater than N.

In some optional embodiments of the present disclosure, the r-th stage of shift register unit is provided with the first clock signal and the N additional clock signals respectively through the N+1 clock signal lines.

In some optional embodiments of the present disclosure, a second signal output terminal of the r-th stage of shift register unit is coupled to a signal input terminal of the (r+x)-th stage of shift register unit, x being a positive integer; and a transmission circuit of the r-th stage of shift register unit is configured to transmit a second clock signal at the second signal output terminal to the signal input terminal of the (r+x)-th stage of shift register unit as an input signal of the (r+x)-th stage of shift register unit.

In a third aspect, a display device is provided according to embodiments of the present disclosure, which includes the gate drive circuitry according to the above embodiments in the second aspect.

In a fourth aspect, embodiments of the present disclosure provide a method for driving the shift register unit according to the above embodiments in the first aspect. The method includes:

in a first period, inputting an input signal with a first level to the signal input terminal, and pulling up a potential of the pull-up control node to the first level;

in a second period, inputting the first clock signal with the first level and the second clock signal with the first level respectively to the output circuit and the transmission circuit, and outputting the first level to the first signal output terminal and the second signal output terminal under the control of the pull-up control node; and in a third period, inputting the first clock signal with a second level to the output circuit, inputting the second clock signal with the first level, and outputting the first level to the second signal output terminal under the control of the pull-up control node.

In some optional embodiments of the present disclosure, the method further includes: in the fourth period, inputting a reset signal of the first level to a reset signal terminal, the pull-up control node, and the first signal output terminal, and resetting potentials at the reset signal terminal, the pull-up control node, and the first signal output terminal to be the second level.

In some optional embodiments of the present disclosure, the method further includes: generating the second clock signal by using the first clock signal and the at least one additional clock signal, where a period of the first clock signal is different from a period of the at least one additional clock signal, and a phase of the first clock signal is different from a phase of the at least one additional clock signal.

In some optional embodiments of the present disclosure, the clock control circuit includes a first transistor group and a second transistor group. The method includes: providing the first clock signal to a transistor in the first transistor group, providing at least one additional clock signal to a transistor in the second transistor group, and generating the second clock signal by the clock control circuit, where a duration of an active level of the first clock signal provided to the transistor in the first transistor group does not overlap with a duration of an active level of the at least one additional clock signal provided to the transistor in the second transistor group, and a pulse width of the second clock signal is determined by a minimum of a phase difference between the first clock signal and the at least one additional clock signal provided to the transistor in the second transistor group.

In some optional embodiments of the present disclosure, the clock control circuit includes a first transistor group and a second transistor group. The method includes: providing the first clock signal and the at least one additional clock signal to transistors in the first transistor group, providing a plurality of additional clock signals to transistors in the second transistor group, and generating the second clock signal by the clock control circuit, where a duration of active levels of the first clock signal and the at least one additional clock signal provided to the transistors in the first transistor group does not overlap with a duration of an active level of the plurality of additional clock signals provided to the transistors in the second transistor group, and a pulse width of the second clock signal is determined by a minimum of phase differences between the first clock signal and the plurality of additional clock signals provided to the transistors in the second transistor group.

BRIEF DESCRIPTION OF THE DRAWINGS

In order to more clearly illustrate the technical solutions of the embodiments of the present disclosure, the drawings to be used in the description of the embodiments of the present disclosure will be described briefly below. Obviously, the drawings in the following description are merely some embodiments of the present disclosure. For a person of ordinary skill in the art, other drawings can also be obtained according to these drawings without the inventive labor.

DETAILED DESCRIPTION

Figure 1A:
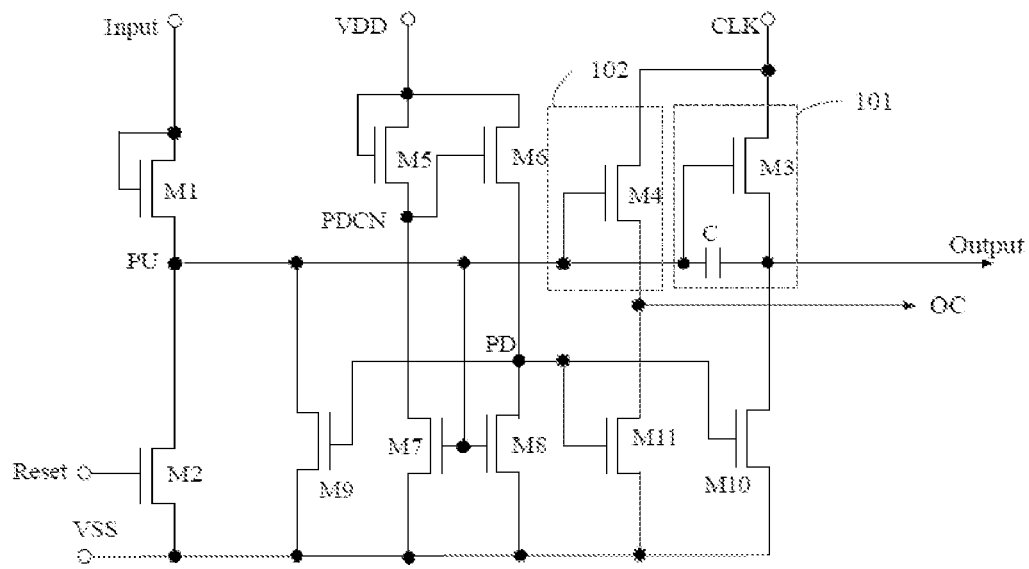
FIG. 1A is an example circuit diagram of a shift register unit.

To illustrate a technical problem to be solved, technical solutions and advantages in embodiments of the present disclosure more clearly, embodiments of the present disclosure will be clearly and completely described below in conjunction with drawings in the embodiments of the present disclosure. It is apparent that the described embodiments are part of not all of the embodiments of the present disclosure. All other embodiments obtained by a person of ordinary skill in the art based on the described embodiments of the present disclosure without departing from the scope of the present disclosure shall fall within the scope of the present disclosure. It should be noted that the same elements are denoted by the same or similar reference signs throughout the drawings. In the following descriptions, some specific embodiments are for illustrative purposes only, and are not to be construed as limiting the present disclosure, which are just examples of embodiments of the present disclosure. Conventional structures or configurations will be omitted when it may cause confusion to the understanding of the present disclosure. It should be noted that the shapes and sizes of the various components in the drawings do not reflect true sizes and proportions thereof, but merely illustrate the contents of the embodiments of the present disclosure.

Technical or scientific terms used in the embodiments of the present disclosure should be of ordinary meaning as understood by a person of ordinary skill in the art, unless otherwise defined. Such terms as "first", "second" and similar words used in the embodiments of the present disclosure do not represent any order, quantity, or importance, but are merely used to distinguish different components.

Further, in the description of the embodiments of the present disclosure, such terms as "connected" or "connected to" may mean that two components are directly connected, or that two components are connected via one or more other components. In addition, the two components can be connected or coupled in a wired or wireless manner.

Further, in the description of the embodiments of the present disclosure, technical terms or scientific terms used in the present disclosure should be in the ordinary meaning as understood by a person of ordinary skill in the art, unless otherwise defined.

Further, in the description of the embodiments of the present disclosure, such terms as "first level" and "second level" are only used to distinguish that magnitudes of the two levels are different. For example, the description may be made hereinafter by taking the "first level" as a relatively high level, and the "second level" as a relatively low level. A person of ordinary skill in the art may appreciate that the present disclosure is not limited thereto.

Transistors used in the embodiments of the present disclosure may each be a thin film transistor, or a field effect transistor, or other devices having the same characteristics. Optionally, the thin film transistor used in the embodiments of the present disclosure may be an oxide semiconductor transistor. Since a source electrode and a drain electrode of the thin film transistor used herein are symmetrical, the source electrode and the drain electrode thereof can be interchanged. In the embodiments of the present disclosure, one of the source electrode and the drain electrode is referred to as a first electrode, and the other of the source electrode and the drain electrode is referred to as a second electrode. In the following examples, an N-type thin film transistor is taken as an example for description. A person of ordinary skill in the art may appreciate that the embodiments of the present disclosure are also applicable to the case of P-type thin film transistors. When a transistor is an N-type transistor, a voltage for turning on the transistor (referred to as a turn-on voltage) is a high level voltage (for example, 5V, 10V, or other suitable voltage), and a voltage for turning off the transistor (referred to as a turn-off voltage) is a low level voltage (for example, 0V, −5V, <10V, or other suitable voltage).

The gate drive circuitry includes a plurality of cascaded shift register units. In the gate drive circuitry, an output signal of a next stage of shift register unit is generally used as a reset signal of a current stage of shift register unit, and an output signal of a previous stage of shift register unit is generally used as an input signal of the current stage of shift register unit.

However, as the number of gate electrodes to be driven increases, the output signal of the shift register unit may be distorted, especially for a display panel having a large area or a high resolution.

Figure 1B:
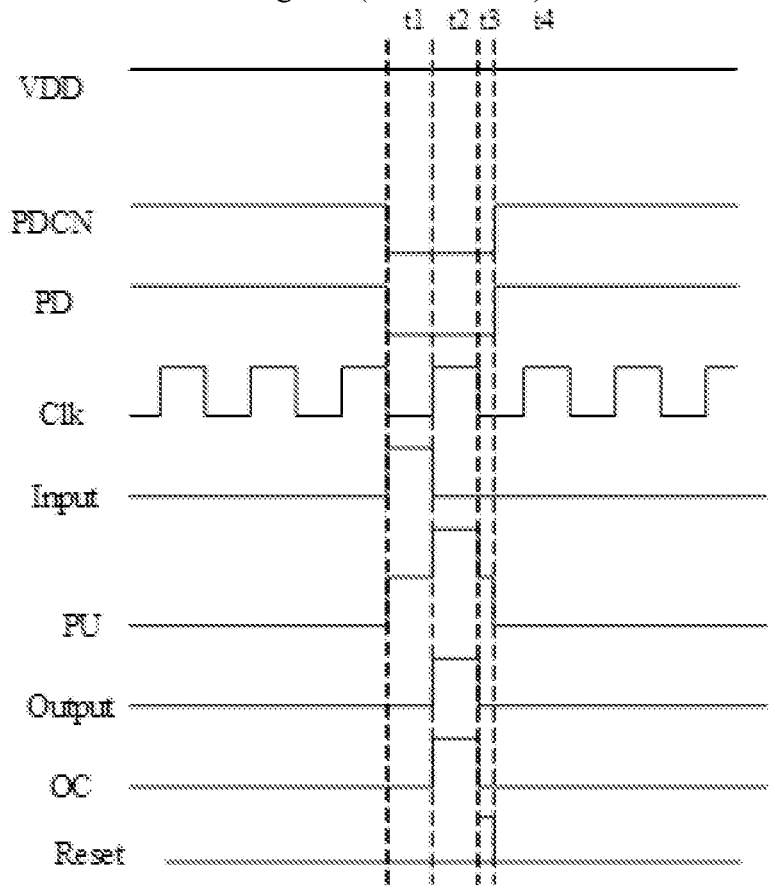
FIG. 1B is a timing diagram of signals showing operation of shift register unit in FIG. 1A.

FIG. 1A is an example of a circuit diagram of a shift register unit, and FIG. 1B is a timing diagram of signals showing operation in the shift register unit of FIG. 1A. Next, the operation of the shift register unit as shown in FIG. 1A will be described with reference to FIGS. 1A and 1B.

As shown in FIG. 1A, the description may be made by taking an example that all switching transistors are NMOS transistors. In the circuit configuration shown in FIG. 1A, description is made by taking an example that a power supply signal terminal VDD is at a high level and a reference signal at a reference signal terminal VSS is a low-level signal.

As shown in FIG. 1B, during the t1 stage, an input signal at a signal input terminal Input is at a high level, the transistor M1 is turned on, and a voltage of the pull-up node PU starts to rise to charge one end of capacitor C. Since the pull-up node PU is at a high level, transistor M7 and transistor M8 are turned on, and the low-level voltage signal VSS is transmitted to the node PDCN and the pull-down control node PD through the transistor M7 and the transistor M8, respectively. At the same time, since the pull-up node PU is at a high level, transistor M3 and transistor M4 are turned on, and a clock signal of clock signal terminal CLK is transmitted to the first signal output terminal Output and the second signal output terminal OC. Since the clock signal Clk is at a low level at this stage, output signals of the first signal output terminal Output and the second signal output terminal OC are at a low level.

During the t2 stage, the clock signal Clk of the clock signal terminal CLK is at a high level. Under the action of the pull-up node PU, the transistor M3 and the transistor M4 are continuously turned on, and the clock signal Clk is transmitted to the first signal output terminal Output and the second signal output terminal OC, such that the output signals of the first signal output terminal Output and the second signal output terminal OC are at a high level. The potential of the pull-up node PU is bootstrapped to a higher potential due to a bootstrap action of the storage capacitor C. Transistor M7 and transistor M8 continue to be turned on, such that the node PDCN and the pull-down control node PD remain at a low level.

During the t3 stage, a reset signal Reset inputted to the reset signal terminal Reset is at a high level, the transistor M2 is turned on, and the pull-up node PU is reset to a low level by the voltage signal VSS. The transistor M5 is turned on, and the high-level voltage signal VDD is transmitted to the node PDCN, which enables the transistor M6 to be turned on. The pull-down control node PD is at a high level, to turn on the transistor M6. Since the clock signal Clk of the clock signal terminal CLK is at a low level in this stage, each of the output signals of the first signal output terminal Output and the second signal output terminal OC is a low-level signal.

During the t4 stage, the reset signal Reset and the input signal Input are both at a low level. The pull-down control node PD is at a high level, and the transistor M9, the transistor M10, and the transistor M11 are turned on, thereby transmitting the low-level voltage signal VSS to the pull-up node PU, the first signal output terminal Output and the second signal output terminal OC through the transistor M9, the transistor M10, and the transistor M11, respectively. Therefore, noises at the pull-up node PU, the first signal output terminal Output and the second signal output terminal OC are continuously reduced.

Figure 1C:
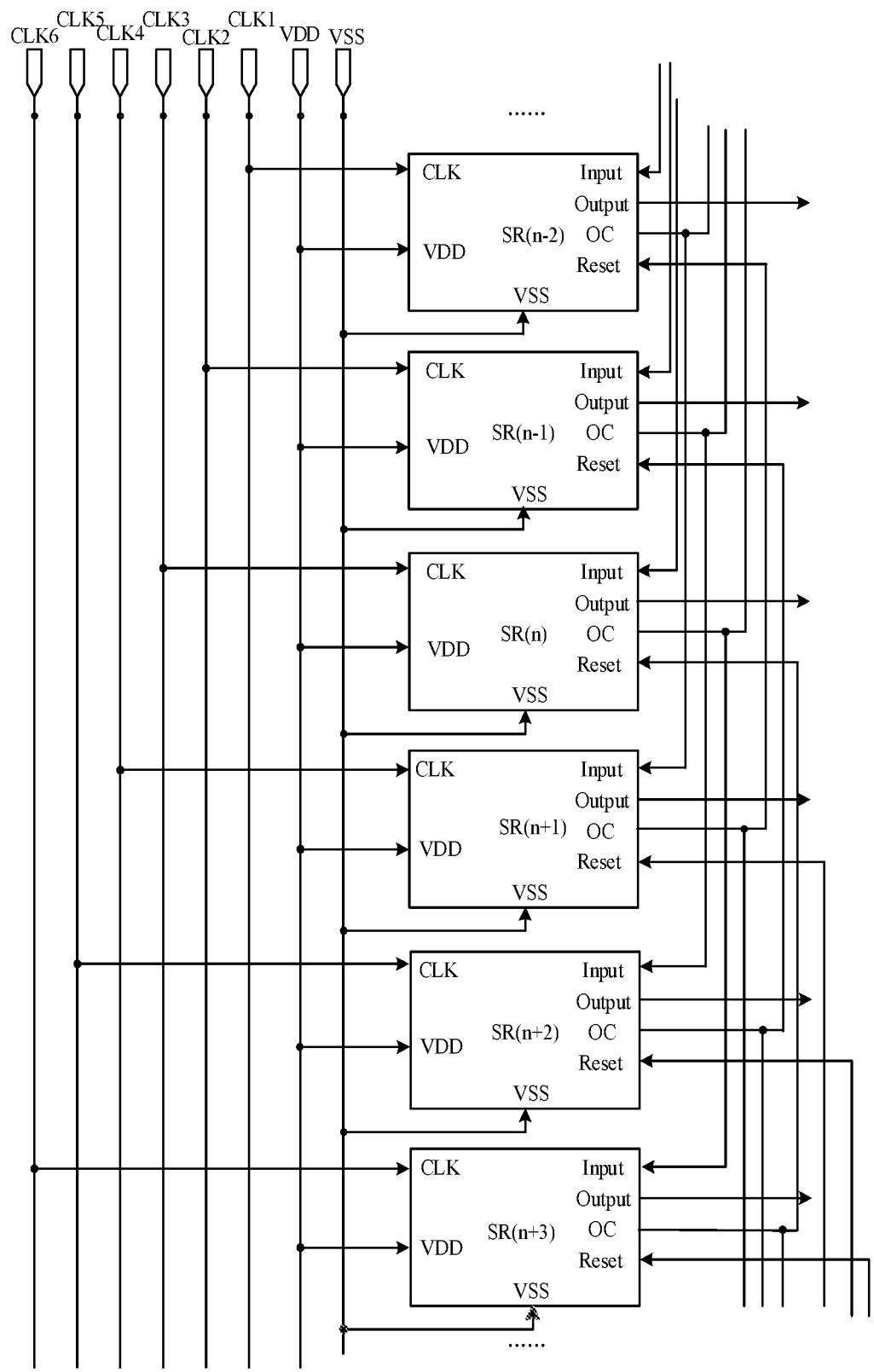
FIG. 1C is a cascade example of the shift register unit in FIG. 1A.

FIG. 1C shows an example of the cascaded shift register units of FIG. 1A. As shown in FIG. 1C, six clock signals CLK1 to CLK6 are used. The clock signal terminals CLK of the (n−2)-th stage of shift register unit SR(n−2) to the (n+3)-th stage of shift register SR(n+3) are sequentially coupled to the clock signal lines CLK1 to CLK6, where n is an integer greater than 2. Taking the n-th stage of shift register SR(n) as an example, the output signal Output at the first signal output terminal of the n-th stage of shift register unit SR(n) is only used as a gate driving signal, and the second signal output terminal OC is coupled to a signal input terminal Input of the (n+3)-th stage of shift register SR(n+3) and a reset signal terminal Reset of the (n−3)-th stage of shift register SR(n−3).

As can be seen from the above, in the circuit structure of FIG. 1A, both the output signals of the first signal output terminal Output and the second signal output terminal OC are determined by the clock signal from the clock signal terminal CLK, and accordingly the first output signal Output and the second output signal OC have the same signal waveform. The first output signal Output is used only as a gate driving signal, and the second output signal OC is used as a control signal between cascaded shift register units in an upper stage and a lower stage in the gate drive circuitry, which can ensure circuit stability of the shift register units. For convenience of description, a circuit composed of the transistor M3 and the capacitor C in FIG. 1A may be referred to as an output circuit 101, a transistor M4 may be referred to as a transmission circuit 102, and a transistor M1 may be referred to as an input circuit.

The inventors have found that if a pulse width of a second output signal OC of a current stage of shift register unit is slightly larger than a pulse width of a first output signal Output, the second output signal OC of the current stage of shift register unit functioning as an input signal of a subsequent stage of shift register unit can extend the charging time of the pull-up node PU of the subsequent stage of shift register unit, and can alleviate a current leakage of the input circuit in the subsequent stage of shift register unit. It is noted that the subsequent stage of shift register unit herein means a shift register unit is immediately subsequent to the current stage of shift register unit or non-immediately subsequent to the current stage of shift register unit.

Figure 2A:
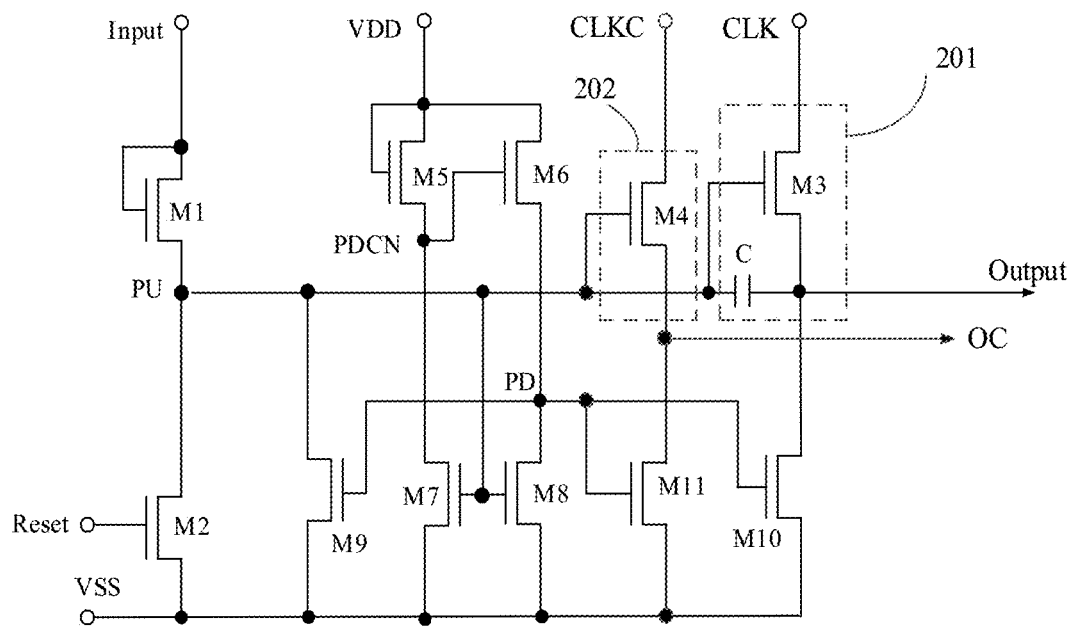
FIG. 2A shows an example circuit diagram of a shift register unit according to embodiments of the present disclosure.
Figure 2B:
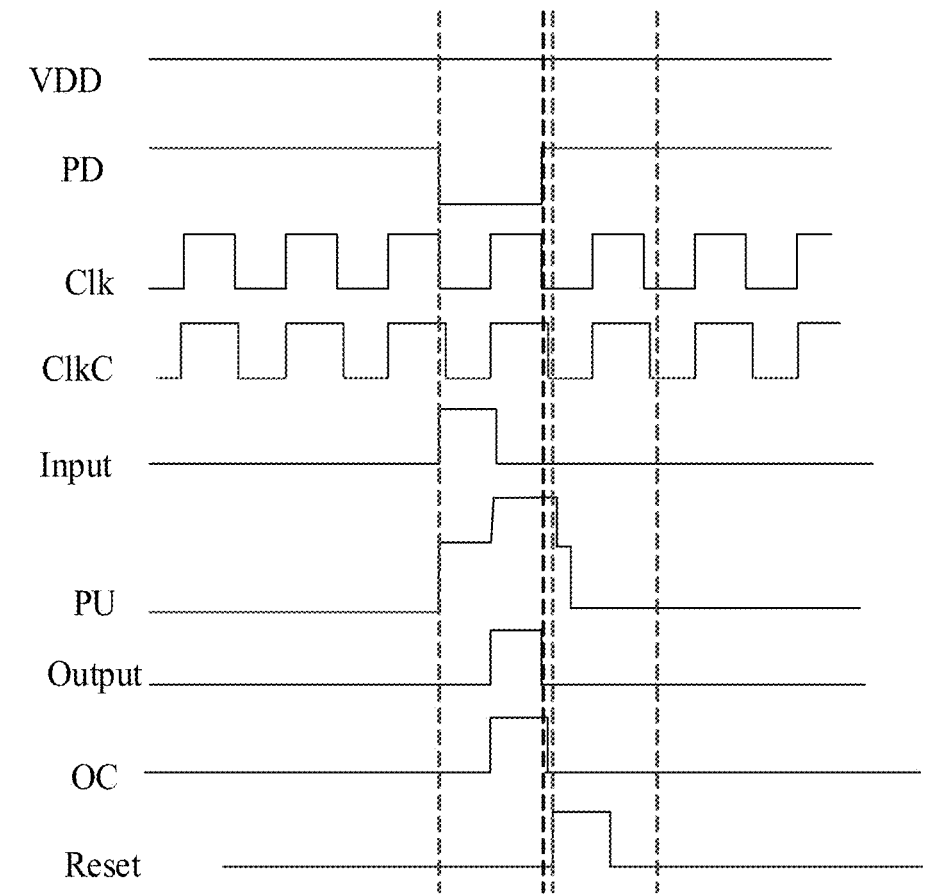
FIG. 2B is a timing diagram of signals showing operation of the shift register unit of FIG. 2A.

FIG. 2A is an example circuit diagram of a shift register unit, and FIG. 2B is a timing diagram of signals showing operation in the shift register unit of FIG. 2A.

As shown in FIG. 2A, the difference between the circuit as shown in FIG. 2A and the circuit shown in FIG. 1A lies in that the output circuit 201 of FIG. 2A is coupled to the clock signal terminal CLK, and the transmission circuit 202 is coupled to the clock signal terminal CLKC. As shown in FIG. 2B, a clock signal ClkC provided by the clock signal terminal CLKC has a same clock cycle as a clock signal Clk provided by the clock signal terminal CLK, and a pulse width of the clock signal ClkC is larger than a pulse width of the clock signal Clk, that is, a duty ratio of the clock signal ClkC is larger than a duty ratio of the clock signal Clk. It can be understood by a person of ordinary skill in the art that the gate drive circuitry formed by a plurality of cascaded shift register units in FIG. 2A has the same cascade relationship as that shown in FIG. 1C, which is not described herein again.

As shown in FIG. 2B, the second output signal OC and the first output signal Output of the current stage of shift register unit have a same period, and a pulse width of the second output signal OC is larger than a pulse width of the first output signal Output. Substantially, the input signal Input of the current stage of shift register unit is the second output signal OC of the previous stage of shift register unit, so that a pulse width of the input signal Input in FIG. 2B is larger than that of the input signal in FIG. 1B. Therefore, the charging time of the pull-up node PU of the current stage of shift register unit can be extended, and the current leakage of the input circuit in the subsequent stage of shift register unit can be alleviated, thereby improving the stability of a waveform of the first output signal Output that functions as the gate driving signal.

However, in the embodiment of FIG. 2A, it is necessary to set a corresponding clock signal line in the display panel to supply the clock signal ClkC to the transmission circuit 202. For example, in the embodiment as shown in FIG. 1C, six clock signals are supplied to the gate drive circuitry shown in FIG. 1C, in addition to setting six clock signal lines to supply clock signals $Clk_1$ to $Clk_6$, additional six clock signal lines are required to supply clock signals $ClkC_1$ to $ClkC_6$, which causes problems such as widening a frame of a display panel and increasing output pins of control IC (integrated circuit) terminals of a source driver.

Figure 3:
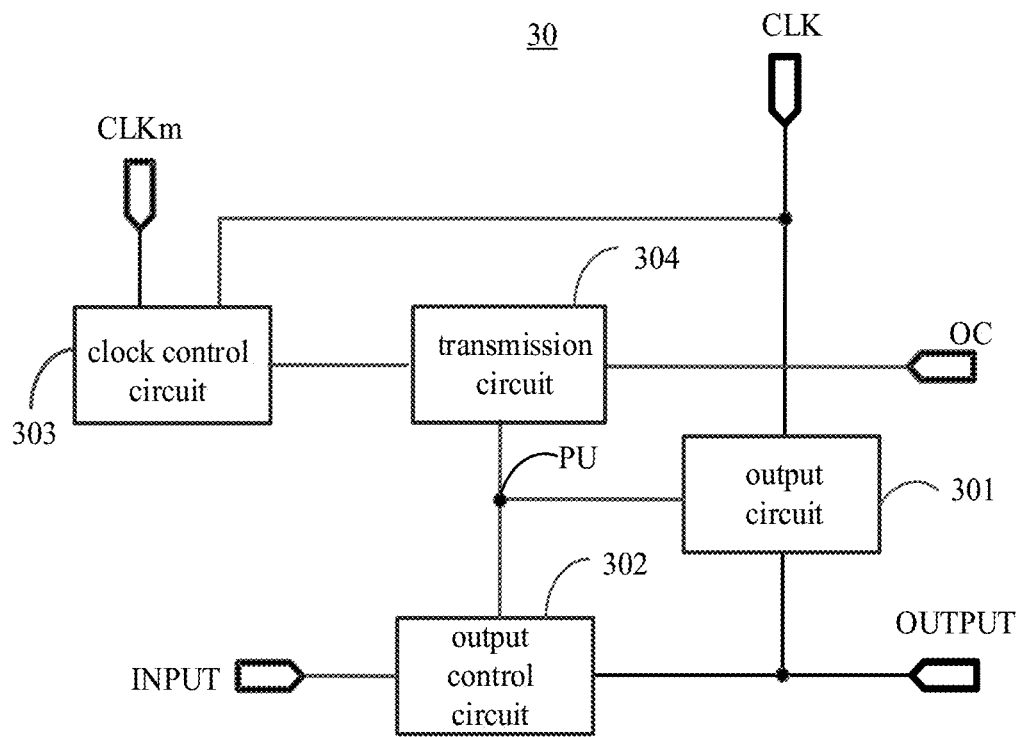
FIG. 3 is a schematic block diagram of a shift register unit according to embodiments of the present disclosure.

Embodiments of the present disclosure further provide a shift register unit. FIG. 3 shows a schematic block diagram of a shift register unit 30 according to embodiments of the present disclosure. As shown in FIG. 3, the shift register unit 30 according to the embodiments of the present disclosure may include an output circuit 301. The output circuit 301 is coupled to a first signal output terminal OUTPUT and a pull-up control node PU. The output circuit 301 is configured to receive a first clock signal Clk and output the first clock signal Clk to the first signal output terminal OUTPUT under the control of a potential of the pull-up control node PU.

The shift register unit 30 may further include an output control circuit 302. The output control circuit 302 may be coupled to the pull-up control node PU and the first signal output terminal OUTPUT, and the output control circuit 302 is configured to receive an input signal Input from a signal input terminal INPUT, and control the potential of the pull-up control node PU and a potential of the first signal output terminal OUTPUT in response to the input signal Input.

The shift register unit 30 may further include a clock control circuit 303. The clock control circuit 303 is configured to receive a first clock signal Clk and at least one additional clock signal $Clk_m$, and to generate a second clock signal ClkC by using the first clock signal Clk and the at least one additional clock signal $Clk_m$, where m is an integer greater than or equal to 1.

The shift register unit 30 may further include a transmission circuit 304. The transmission circuit 304 is coupled to the clock control circuit 303, the second signal output terminal OC, and the pull-up control node PU. The transmission circuit 304 may be configured to receive the second clock signal ClkC and output the second clock signal ClkC to the second signal output terminal OC under the control of the potential of the pull-up control node PU.

According to an embodiment of the present disclosure, the clock control circuit 303 may be configured such that a period of the second clock signal ClkC is the same as a period of the first clock signal Clk, and a pulse width $W_{P2}$ of the second clock signal ClkC is larger than a pulse width of the first clock signal $W_{P1}$. The first clock signal Clk and the at least one additional clock signal $Clk_m$ may have a same period and different phases from each other.

A person of ordinary skill in the art may appreciate that the clock signal may be a periodic pulse signal having a specific period Tc and duty cycle. The term "pulse width" herein refers to a duration of an active level of a pulse signal. An example that the "active level" is a high level is taken in the following example embodiments. For example, the first clock signal may be a square wave signal with a duty cycle of less than 50%, i.e., the duration of the active level does not exceed 50% of the cycle Tc of the signal, for example 40%.

Figure 4A:
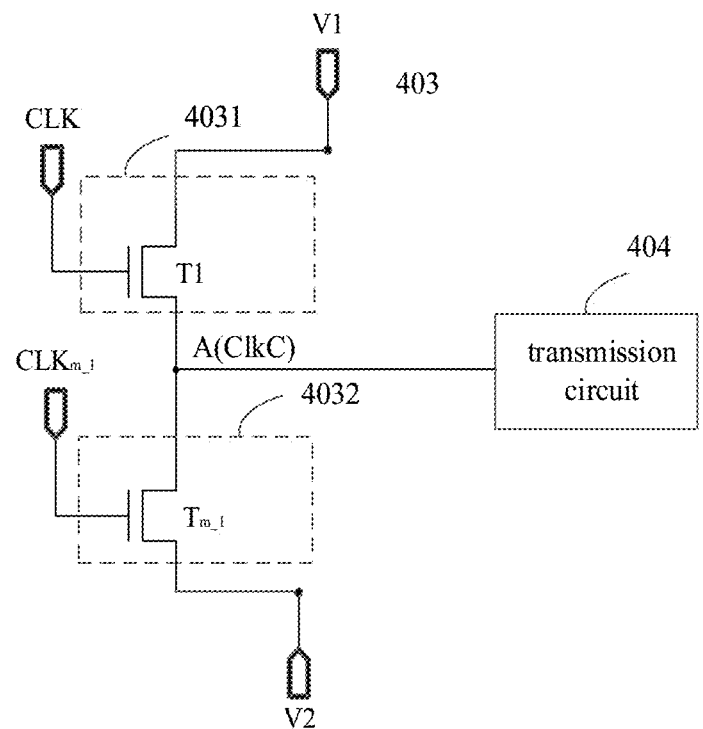
FIG. 4A is an example circuit diagram of a clock control circuit according to embodiments of the present disclosure.

FIG. 4A shows an example circuit diagram of a clock control circuit according to embodiments of the present disclosure. As shown in FIG. 4A, the clock control circuit 403 may include a first transistor group 4031 and a second transistor group 4032. The first transistor group 4031 may include a first transistor T1 having a gate electrode used to receive a first clock signal Clk, a first electrode coupled to the first voltage terminal V1 and a second electrode coupled to the transmission circuit 404. For example, the first clock signal Clk may be supplied to the first transistor T1 through the clock signal terminal CLK. The second transistor group 4032 may include m transistors $T_{m\_1} \ldots T_{m\_m}$, first electrodes of the m transistors $T_{m\_1} \ldots T_{m\_m}$ are coupled to the second voltage terminal V2, second electrodes of the m transistors $T_{m\_1} \ldots T_{m\_m}$ are coupled to the transmission circuit 404, and gate electrodes of the m transistors $T_{m\_1} \ldots T_{m\_m}$ are respectively used to receive at least one additional clock signal $Clk_{m\_1} \ldots Clk_{m\_m}$. For example, the at least one additional clock signal $Clk_{m\_1} \ldots Clk_{m\_m}$ may be supplied to the transistors $T_{m\_1} \ldots T_{m\_m}$ through the at least one clock signal terminal $Clk_m$. As described above, m is an integer greater than or equal to 1.

A person of ordinary skill in the art may appreciate that although FIG. 4A shows that the second transistor group 4032 includes only one transistor $T_{m\_1}$, the second transistor group 4032 may include a plurality of transistors, that is, m may be greater than one. First electrodes of the plurality of transistors are coupled to the second voltage terminal V2, and second electrodes are coupled to the transmission circuit, and gate electrodes are each coupled to receive one of the plurality of additional clock signals $Clk_{m\_1} \ldots Clk_{m\_m}$.

The first voltage terminal V1 may be configured to keep inputting a high-level signal as the first voltage signal, and the second voltage terminal V1 may be configured to keep inputting a low-level signal as the second voltage signal, which applies to the description of each of the following example embodiments. For example, the first voltage signal may have a voltage of 36V and the second voltage terminal V2 may be grounded, i.e., at a zero potential. In addition, the second voltage signal may also be at a system voltage of −16V.

Figure 4B:
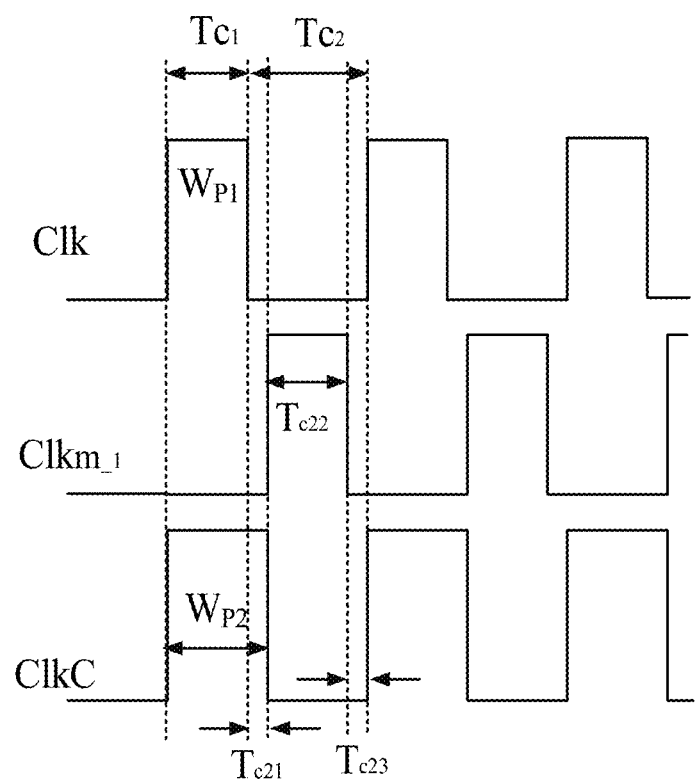
FIG. 4B is a timing diagram of signals in the clock control circuit of FIG. 4A.

FIG. 4B is an example timing diagram of signals showing operation of the clock control circuit 403 of FIG. 4A. Next, the operation of the clock control circuit 403 of FIG. 4A will be described in detail with reference to FIGS. 4A and 4B.

As shown in FIG. 4B, one clock period Tc of the first clock signal Clk may be divided into a period $Tc_1$ and a period $Tc_2$.

During the period $Tc_1$, the first clock signal Clk is at a high level, the first transistor T1 is turned on, the second clock signal ClkC at the node A is pulled up to a high level by the high-level first voltage V1, and the high-level first voltage V1 is transmitted to the transmission circuit 404 through the node A. During the period $Tc_1$, the additional clock signal $Clk_{m\_1}$ is at a low level, and the transistor $T_{m\_1}$ is turned off.

During the period $Tc_2$, the first clock signal Clk is at a low level, and the first transistor T1 is turned off. The period $Tc_2$ may be divided into a sub-period $Tc_{21}$, a sub-period $Tc_{22}$, and a sub-period $Tc_{23}$. During the sub-period $Tc_{21}$, the additional clock signal $Clk_{m\_1}$ is at a low level, and the transistor $T_{m\_1}$ remains off. It may be understood by a person of ordinary skill in the art that the voltage outputted from the clock control circuit 403 to the transmission circuit 404 at this time may be slightly lower than the first voltage signal V1, but may still be in a high level period of the second clock signal ClkC. For convenience of presentation, ClkC during the sub-period $Tc_{21}$ in FIG. 4B is shown to have the same level as during the period Tc1. Next, during the sub-period $Tc_{22}$, the additional clock signal $Clk_{m\_1}$ is at a high level, the transistor $T_{m\_1}$ is turned on, and the low-level second voltage signal V2 is outputted to the transmission circuit 404, to start a low-level period of the second clock signal ClkC. During the sub-period $Tc_{23}$, the additional clock signal $Clk_{m\_1}$ is at a low level, and the transistor $T_{m\_1}$ is turned off. However, since no high-level signal is inputted into the clock control circuit 403 during this period, the clock control circuit 403 keeps outputting a low level to the transmission circuit 404 until the first clock signal Clk becomes a high level in the next clock period.

As described above, compared with the duration $T_{c1}$ of the active level (e.g., high level) of the first clock signal Clk, a duration of the active level of the second clock signal ClkC is extended by the sub-period $Tc_{21}$, and thus it is able to output a second clock signal ClkC with the pulse width $W_{P2}$ larger than the pulse width $W_{P1}$ of the first clock signal Clk to the transmission circuit 404.

It can be seen from the circuit diagram in FIG. 4A and the timing diagram in FIG. 4B that the pulse width $W_{P2}$ of the second clock signal ClkC is equal to the time length between a rising edge of the first clock signal Clk supplied to the first transistor group 4031 and a rising edge of the additional clock signal $Clk_{m\_1}$ supplied to the second transistor group 4032. That is, the pulse width $W_{P2}$ of the second clock signal ClkC is determined by a difference of phases between the first clock signal Clk and the additional clock signal $Clk_{m\_1}$.

The inventors found through actual circuit experiments that, based on the generated second clock signal with a large pulse width, the leakage current of the array substrate (GOA) panel including the gate drive circuitry in the embodiments of the present disclosure can be reduced by 6.7% relative to the related art.

A person of ordinary skill in the art may appreciate that the circuit diagram in FIG. 4A and the timing diagram in FIG. 4B are merely examples, and clock signals having different waveforms may be provided according to an embodiment of the present disclosure, as long as the second clock signal ClkC can be generated based on the first clock signal Clk and the at least one additional clock, the period of the second clock signal ClkC is the same as the period of the first clock signal Clk, and the pulse width of the second clock signal ClkC is larger than the pulse width of the first clock signal Clk. The duration of the active level (high level) of the first clock signal Clk does not overlap with the duration of the active level of the additional clock signal $Clk_{m\_1}$. That is, the period $T_{c1}$ in FIG. 4B does not overlap with the period $Tc_{22}$ in FIG. 4B.

Figure 5A:
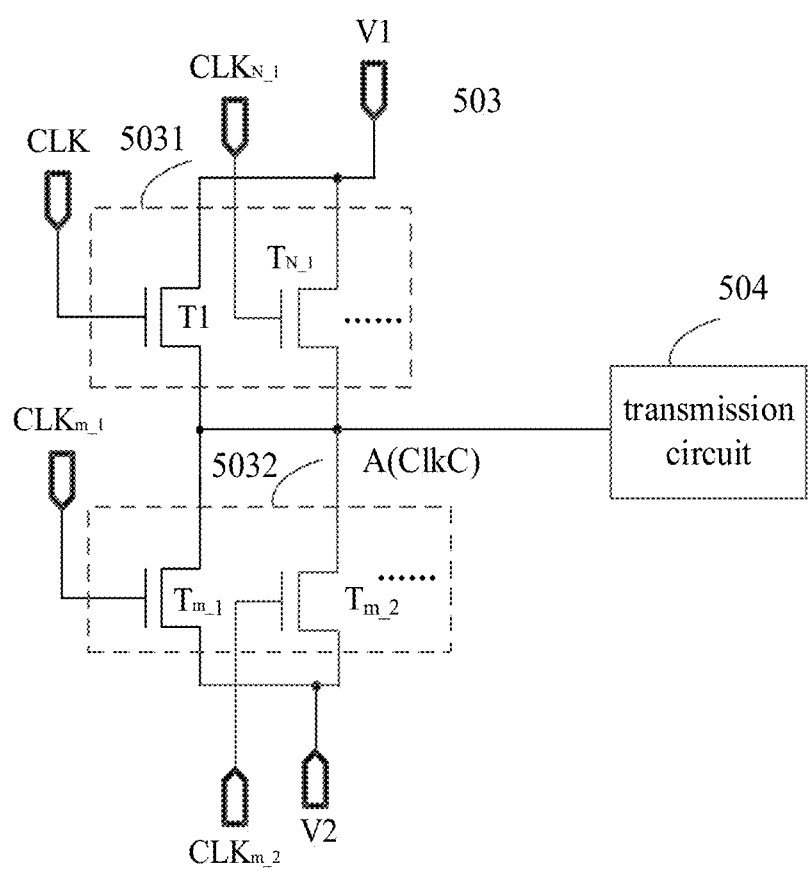
FIG. 5A is another example circuit diagram of a clock control circuit according to embodiments of the present disclosure.

FIG. 5A is another example circuit diagram of a clock control circuit according to embodiments of the present disclosure. As shown in FIG. 5A, the clock control circuit 503 may include a first transistor group 5031 and a second transistor group 5032. The first transistor group 5031 may include a first transistor T1 having a gate used to receive a first clock signal Clk, a first electrode coupled to a first voltage terminal V1, and a second electrode coupled to the transmission circuit 504. The second transistor group 5032 may include m transistors $T_{m\_1} \ldots T_{m\_m}$, first electrodes of the m transistors $T_{m\_1} \ldots T_{m\_m}$ are coupled to the second voltage terminal V2, second electrodes of the m transistors $T_{m\_1} \ldots T_{m\_m}$ are coupled to the transmission circuit 504, and gate electrodes of the m transistors $T_{m\_1} \ldots T_{m\_m}$ are respectively used to receive at least one additional clock signal $Clk_{m\_1} \ldots Clk_{m\_m}$. As described above, m is an integer greater than or equal to 1. FIG. 5A shows that the second transistor group 5032 includes two transistors $T_{m\_1}$ and $T_{m\_2}$, that is, FIG. 5A shows a case where m is greater than 1. The first electrode of the transistor $T_{m\_1}$ is coupled to the second voltage V2, the second electrode of the transistor $T_{m\_1}$ is coupled to the transmission circuit, and the gate electrode of the transistor $T_{m\_1}$ is used to receive the additional clock signal $Clk_{m\_1}$. The first electrode of the transistor $T_{m\_2}$ is coupled to the second voltage V2, the second electrode of the transistor $T_{m\_2}$ is coupled to the transmission circuit, and the gate electrode of the transistor $T_{m\_2}$ is for receiving the additional clock signal $Clk_{m\_2}$. It can be understood by a person of ordinary skill in the art that the second transistor group 5032 may include a plurality of transistors, first electrodes of the plurality of transistors is coupled to the second voltage terminal V2, and second electrodes of the plurality of transistors is coupled to the transmission circuit 504, and gate electrodes of the plurality of transistors are respectively coupled to at least one additional clock signal $Clk_{m\_1} \ldots Clk_{m\_m}$, which are not described repeatedly herein for brevity.

Unlike the clock control circuit 403 shown in FIG. 4A, in addition to the first transistor T1, the first transistor group 5031 in the clock control circuit 503 of FIG. 5A further includes N-m transistors $TN_{\_1} \ldots TN_{\_N\text{-}m}$. First electrodes of the N-m transistors are coupled to the first voltage V1, second electrodes of the N-m transistors are coupled to the transmission circuit 504, and gate electrodes of the N-m transistors are respectively used to receive N-m additional clock signals, where N is the number of the at least one additional clock signal and N is greater than m. In the example circuit configuration of FIG. 5A, N is equal to 3 and m is equal to 2. That is, in addition to the transistor T1, the first transistor group 5031 further includes one transistor $T_{N\_1}$. The first electrode of the transistor $T_{N\_1}$ is coupled to the first voltage V1, the second electrode of the transistor $T_{N\_1}$ is coupled to the transmission circuit 504, and the gate electrode of the transistor $T_{N\_1}$ is used to receive the additional clock signal $Clk_{N\_1}$. The gate electrodes of the m (m=2) transistors of the second transistor group 5032 are respectively used to receive the remaining two additional clock signals $Clk_{m\_1}$ and $Clk_{m\_2}$ of the N additional clock signals.

Figure 5B:
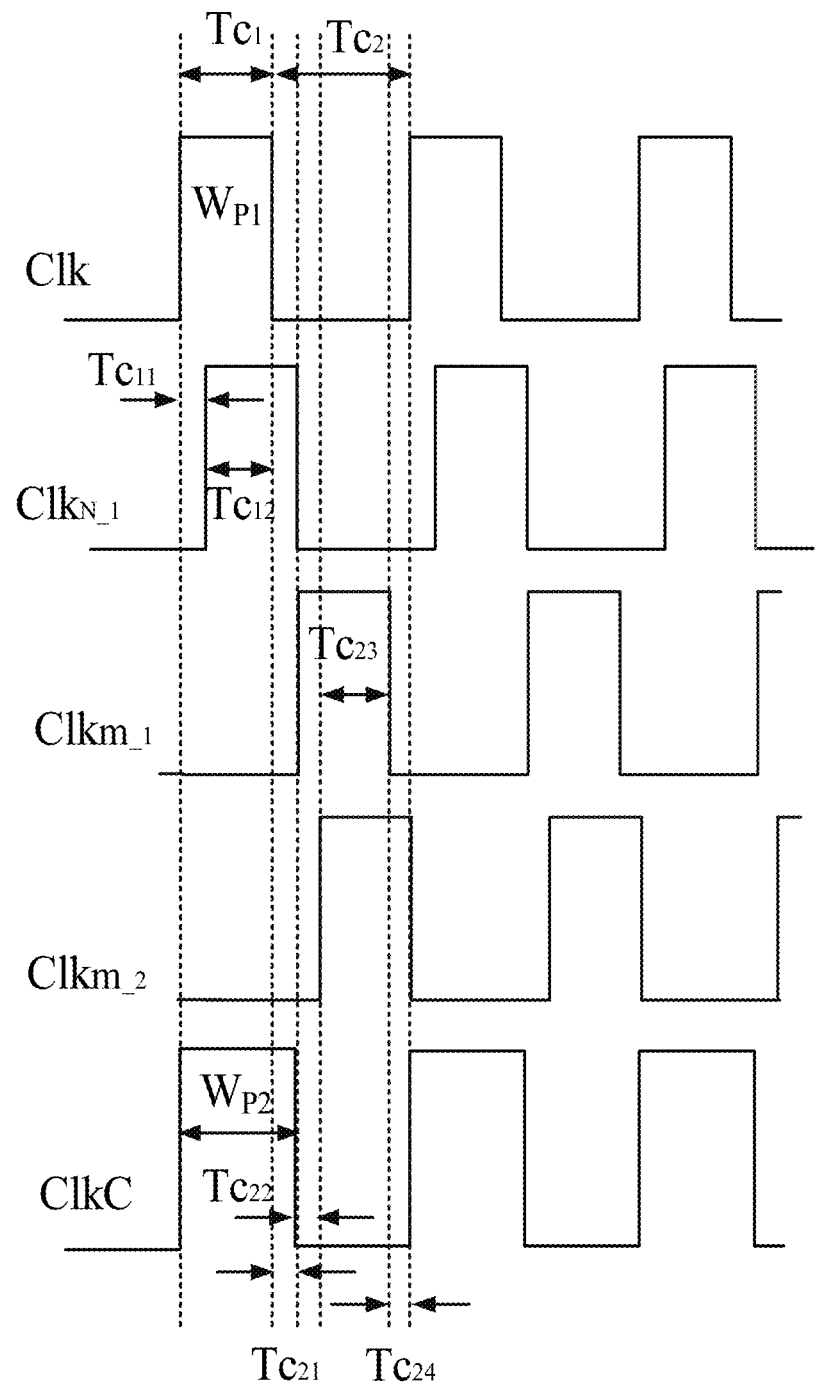
FIG. 5B is a timing diagram of signals in the clock control circuit of FIG. 5A.

FIG. 5B shows an example timing diagram of signals of the clock control circuit 503 of FIG. 5A. Next, the operation of the clock control circuit 503 of FIG. 5A will be described in detail with reference to FIGS. 5A and 5B.

As shown in FIG. 5B, similar to FIG. 4B, one clock period Tc of the first clock signal Clk may be divided into a period $Tc_1$ and a period $Tc_2$.

During the period $Tc_1$, the first clock signal Clk is at a high level, the first transistor T1 is turned on, the second clock signal ClkC at the node A is pulled up to a high level by the high-level first voltage V1, and the high-level first voltage V1 is transmitted to the transmission circuit 404 through the node A. The additional clock signal $Clk_{m\_1}$ and the additional clock signal $Clk_{m\_2}$ are each at a low level, and the transistors $T_{m\_1}$ and $T_{m\_2}$ in the second transistor group are turned off.

According to an embodiment of the present disclosure, the period Tc1 may be divided into a sub-period $Tc_{11}$ and a sub-period $Tc_{12}$. During the sub-period $Tc_{11}$, the additional clock signal $Clk_{N\_1}$ is at a low level, and the transistor $T_{N\_1}$ in the first transistor group is turned off. During the sub-period $Tc_{12}$ in the period $Tc_1$, the additional clock signal $Clk_{N\_1}$ is at a high level, and the transistor $T_{N\_1}$ in the first transistor group is turned on, and also outputs the high-level first voltage signal V1 to the transmission circuit 504.

During the period $Tc_2$, the first clock signal Clk is at a low level, and the first transistor T1 is turned off. The period $Tc_2$ may be divided into a sub-period $Tc_{21}$, a sub-period $Tc_{22}$, a sub-period $Tc_{23}$, and a sub-period $Tc_{24}$.

During the sub-period $Tc_{21}$, the additional clock signal $Clk_{m\_1}$ and the additional clock signal $Clk_{m\_2}$ are each at a low level, and the transistor $T_{m\_1}$ and the transistor $T_{m\_2}$ remain off. The additional clock signal $Clk_{N\_1}$ is still at a high level, the transistor $T_{N\_1}$ continues to be turned on, and the high-level first voltage V1 enables the second clock signal ClkC at the node A to remain at a high level, thereby keeping the high-level first voltage V1 being outputted to the transmission circuit 504. Therefore, as compared with the clock control circuit 403 shown in FIG. 4A, the clock control circuit 503 in this embodiment can output the ClkC signal with more stable high level to the transmission circuit 504 during the sub-period $Tc_{21}$.

Next, during the sub-period $Tc_{22}$, the additional clock signal $Clk_{N\_1}$ turns to a low level, and the transistor $T_{N\_1}$ is turned off. The additional clock signal $Clk_{m\_1}$ turns to a high level, the transistor $T_{m\_1}$ is turned on, the second clock signal ClkC at the node A turns to a low level due to the low-level second voltage V2, and the low-level second voltage V2 is outputted to the transmission circuit 504 through the node A. Compared with a duration $Tc_1$ of the high level of the first clock signal Clk, a duration of the high level of the second clock signal ClkC is extended by the period $Tc_{21}$, thus a pulse width $W_{P2}$ of the second clock signal ClkC is larger than a pulse width $W_{P1}$ of the first clock signal.

Next, during the sub-period $Tc_{23}$, the additional clock signal $Clk_{N\_1}$ is still at a low level, and the transistor $T_{N\_1}$ is turned off. The additional clock signal $Clk_{m\_1}$ is still at a high level, and the transistor $T_{m\_1}$ continues to be turned on. At the same time, the additional clock signal $Clk_{m\_2}$ becomes a high level, the transistor $T_{m\_2}$ is turned on, the low-level second voltage signal V2 starts to be outputted to the transmission circuit 504, and the low-level period of the second clock signal ClkC maintains.

Next, during the sub-period $Tc_{24}$, the additional clock signal $Clk_{N\_1}$ is still at a low level, and the transistor $T_{N\_1}$ is turned off. The additional clock signal $Clk_{m\_1}$ turns to a low level, and the transistor $T_{m\_1}$ is turned off. At the same time, the additional clock signal $Clk_{m\_2}$ is still at a high level, the transistor $T_{m\_2}$ remains being on, the low-level second voltage signal V2 continues to be outputted to the transmission circuit 504, and the low level of the second clock signal ClkC is continued until the next high level of the first clock signal Clk arrives.

As shown in FIG. 5B, the period and pulse width of the second clock signal ClkC outputted by the clock control circuit 503 in FIG. 5A are the same as those of the second clock signal ClkC outputted by the clock control circuit 403 of FIG. 4A. The transistor $T_{N\_1}$ and the transistor $T_{m\_2}$ are additionally set, and the additional clock signals $Clk_{N\_1}$ and $Clk_{m\_2}$ are supplied to the transistor $T_{N\_1}$ and the transistor $T_{m\_2}$, respectively, so that $T_{N\_1}$ is turned on during the $Tc_{21}$ period, and the second clock signal ClkC at the node A is stably maintained at a high level of the high-level first voltage V1. Therefore, the clock control circuit 503 in FIG. 5A can obtain the second clock signal ClkC having a more stable waveform.

It can be seen from the circuit diagram of FIG. 5A and the timing diagram of FIG. 5B, the pulse width $W_{P2}$ of the second clock signal ClkC is determined by a minimum of phase differences between the first clock signal Clk and the additional clock signals $Clk_{m\_1}$ and $Clk_{m\_2}$ provided to the second transistor group 5032.

It can be understood by a person of ordinary skill in the art that the circuit diagram in FIG. 5A and the timing diagram in FIG. 5B are merely examples. According to embodiments of the present disclosure, circuit with other structures may be designed and clock signals having different waveforms may be provided to the circuit, as long as the second clock signal ClkC can be generated based on the first clock signal Clk and the at least one additional clock, the period of the second clock signal ClkC is the same as the period of the first clock signal Clk, and the pulse width of the second clock signal ClkC is larger than the pulse width of the first clock signal Clk. The duration of the active level (high level) of the first clock signal Clk does not overlap with the duration of the active level of the additional clock signal $Clk_{m\_1}$. It should be noted that, according to an embodiment of the present disclosure, the high-level period of the second clock signal ClkC is triggered by a rising edge of the first clock signal Clk, and a low-level period of the second clock signal ClkC is triggered by a rising edge of the additional clock signal $Clk_{m\_1}$. Therefore, the pulse width of the second clock signal ClkC can be flexibly adjusted by providing the clock control circuit with additional signals $Clk_{m\_1}$ having different timing sequences.

Further, the second clock signal ClkC with a more stable waveform can be obtained by, for example, the additional clock signals $Clk_{N\_1}$ and $Clk_{m\_2}$. In order to obtain the second clock signal ClkC with a more stable waveform, for example, a duration of an active level of the additional clock signal $Clk_{N\_1}$ supplied to the first transistor group does not overlap with a duration of an active level of the additional clock signal $Clk_{m\_1}$ or a duration of an active level of the additional clock signal $Clk_{m\_2}$ supplied to the second transistor group. That is, the period $Tc_{12}+Tc_{21}$ in FIG. 5B does not overlap with the period $Tc_{22}+Tc_{23}$ or the period $Tc_{23}+Tc_{24}$.

Figure 6A:
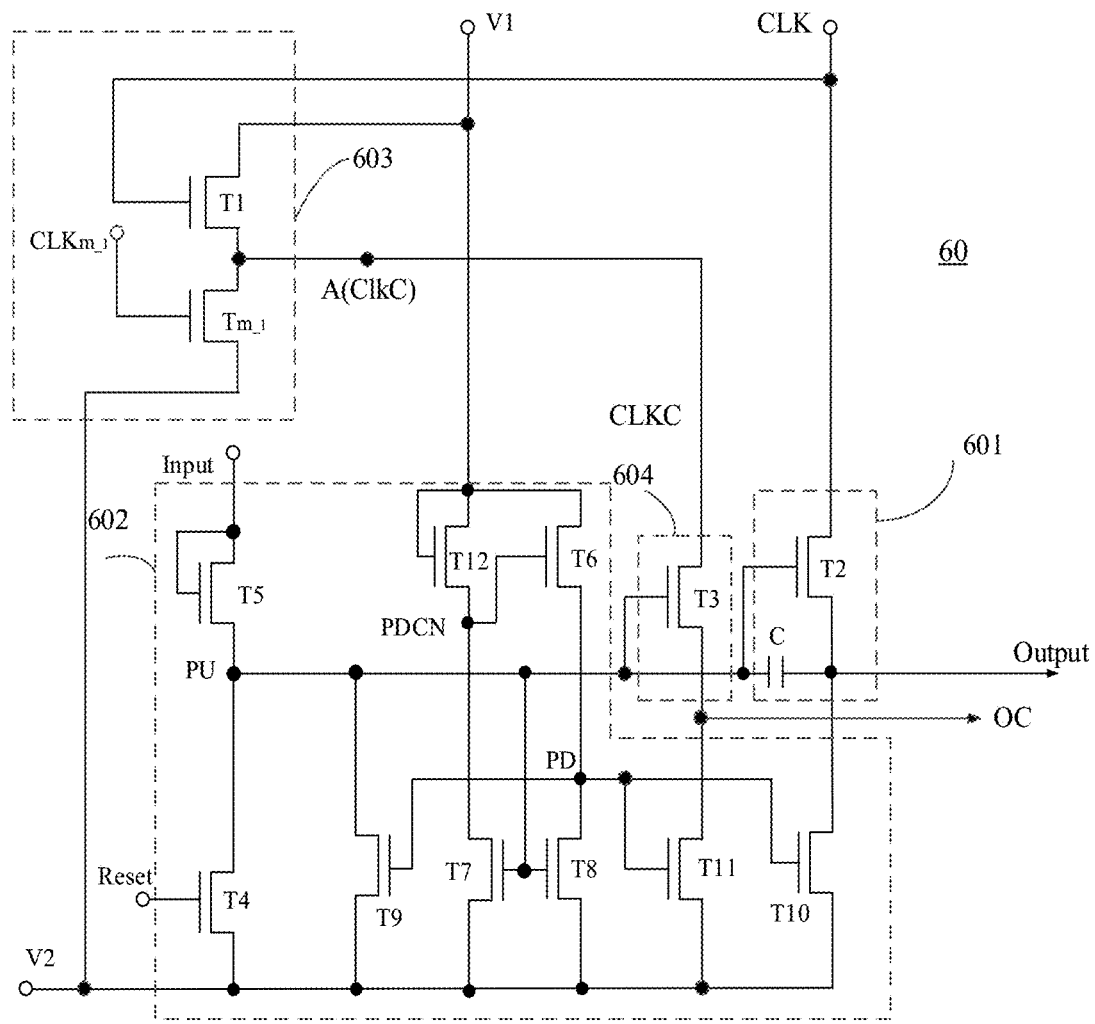
FIG. 6A is an example circuit diagram of a shift register unit according to embodiments of the present disclosure.

FIG. 6A shows an example circuit diagram of a shift register unit according to embodiments of the present disclosure. As shown in FIG. 6A, the shift register unit 60 according to the embodiments of the present disclosure includes an output circuit 601. The output circuit 601 may include a second transistor T2 and a capacitor C. A gate electrode of the second transistor T2 is coupled to the pull-up control node PU, a first electrode of the second transistor T2 is used to receive the first clock signal Clk, and a second electrode of the second transistor T2 is coupled to the first signal output terminal OUTPUT. A first end of the capacitor C is coupled to the gate electrode of the second transistor T2, and a second end of the capacitor C is coupled to the first signal output terminal OUTPUT.

The transmission circuit 604 of the shift register unit 60 may include a third transistor T3. A gate electrode of the third transistor T3 is coupled to the pull-up control node PU, a first electrode of the third transistor T3 is coupled to the node A and used to receive the second clock signal ClkC, and a second electrode of the third transistor T3 is coupled to the second signal output terminal OC.

The output control circuit 602 of the shift register unit 60 is configured to receive a reset signal Reset from a reset signal terminal RESET and reset a potential of the pull-up control node PU under the control of the reset signal Reset. For example, the output control circuit 602 may include a fourth transistor T4. A gate electrode of the fourth transistor T4 is used to receive the reset signal Reset, a first electrode of the fourth transistor T4 is coupled to the second voltage terminal V2, and a second electrode of the fourth transistor T4 is coupled to the pull-up control node PU. In addition, a person of ordinary skill in the art can understand that the output control circuit 602 may also be configured to receive the reset signal Reset and reset potentials of the first signal output terminal OUTPUT and the second signal output terminal OC under the control of the reset signal Reset, which are not described repeatedly herein for brevity.

The output control circuit 602 may further include a fifth transistor T5. A gate electrode and a first electrode of the fifth transistor T5 are used to receive an input signal Input, and a second electrode of the fifth transistor T5 is coupled to the pull-up control node PU. With the above circuit structure, the output control circuit 602 receives the input signal Input from a signal input terminal, and raises the potential of the pull-up control node PU in response to the input signal Input, and the capacitor C in the output circuit 601 is charged by the raised potential of the pull-up control node PU.

In addition, as shown in FIG. 6A, the output control circuit 602 according to an embodiment of the present disclosure may include a sixth transistor T6, a seventh transistor T7, an eighth transistor T8, a ninth transistor T9, a tenth transistor T10, an eleventh transistor T11, and a twelfth transistor T12. With the above circuit structure, the output control circuit 602 controls the potentials of the first signal output terminal OUTOUT and the second signal output terminal OC under the control of the potential of the pull-up control node PU, and pulls down the potentials of the pull-up node PU, the first signal output terminal OUTPUT, and the second signal output terminal OC based on a potential of the control node PD and under the control of the first voltage signal V1. The above-described circuit structure in FIG. 6A may be referred to as a first pull-down control sub-circuit for convenience of description.

Further, as shown in FIG. 6A, the clock control circuit 603 has an example circuit structure similar to that shown in FIG. 4A. Specifically, the clock control circuit 603 may include a first transistor T1, having a gate electrode used to receive the first clock signal Clk, a first electrode coupled to the first voltage terminal V1, and a second electrode coupled to a node A. The clock control circuit 603 may also include a transistor $T_{m\_1}$, having a first electrode of the transistor $T_{m\_1}$ coupled to the second voltage terminal V2, a second electrode coupled to the node A, and a gate electrode used to receive the additional clock signal $Clk_{m\_1}$. The clock control circuit 603 generates a second clock signal ClkC based on the first clock signal Clk and at least one additional clock signal $Clk_{m\_1}$, and transmits the second clock signal ClkC to the first electrode of the third transistor T3 in the transmission circuit 604 through the node A.

Figure 6B:
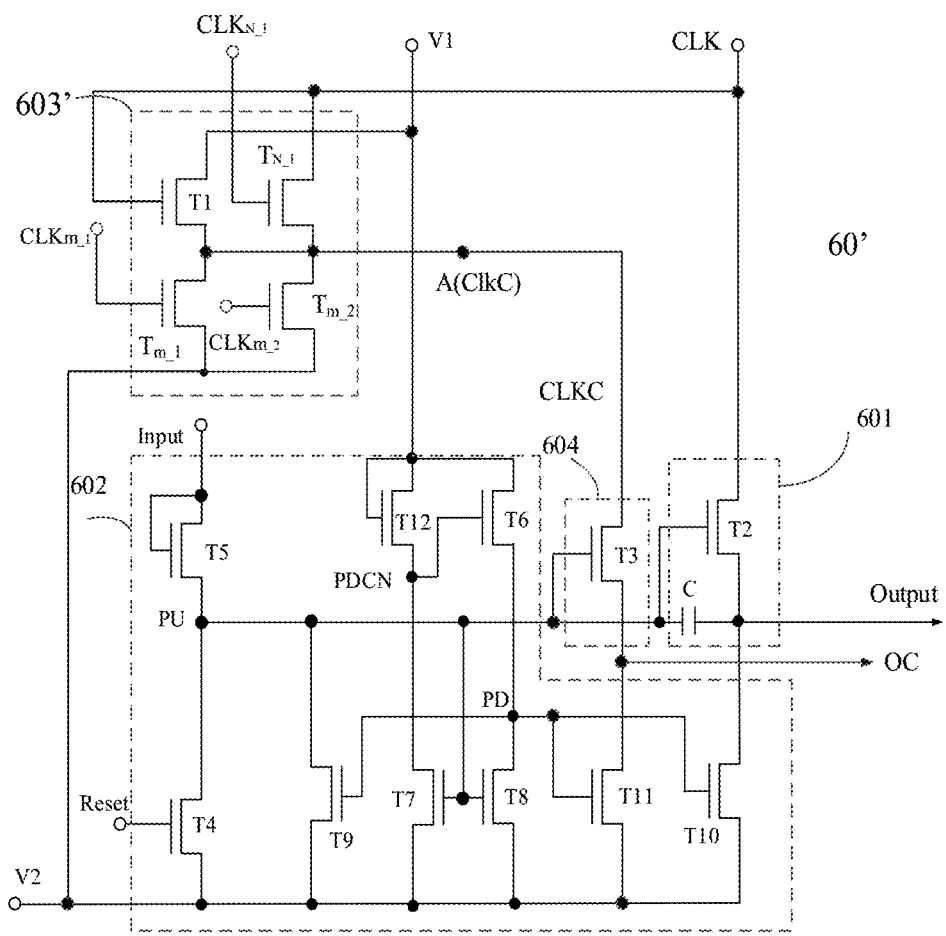
FIG. 6B is another example circuit diagram of a shift register unit according to embodiments of the present disclosure.

FIG. 6B is another example circuit diagram of a shift register unit according to embodiments of the present disclosure. As shown in FIG. 6B, unlike the example shown in FIG. 6A, the clock control circuit 603' of the shift register unit 60' has a structure similar to the clock control circuit 603 shown in FIG. 5A. The clock control circuit 603' may further include a transistor $T_{N\_1}$, having a first electrode coupled to the first voltage terminal V1, a second electrode coupled to the node A, and a gate electrode used to receive the additional clock signal $Clk_{N\_1}$. The clock control circuit 603 may further include a transistor $T_{m\_2}$, which has a first electrode coupled to the second voltage terminal V2, a second electrode coupled to the node A, and a gate electrode used to receive the additional clock signal $Clk_{m\_2}$. The clock control circuit 603' generates a second clock signal ClkC at the node A based on the first clock signal Clk and the additional clock signals $Clk_{N\_1}$, $Clk_{m\_1}$, $Clk_{m\_2}$, and transmits the second clock signal ClkC to the first electrode of the third transistor T3 in the transmission circuit 604 through the node A.

It may be understood by a person of ordinary skill in the art that the circuit diagrams of the clock control circuit as shown in FIGS. 6A and 6B are merely examples, and the clock control circuit may have other circuit configurations as long as the second clock signal can be generated based on the first clock signal and the at least one additional clock signal, a period of the second clock signal is the same as a period of the first clock signal, and a pulse width of the second clock signal is larger than a pulse width of the first clock signal.

Figure 6C:
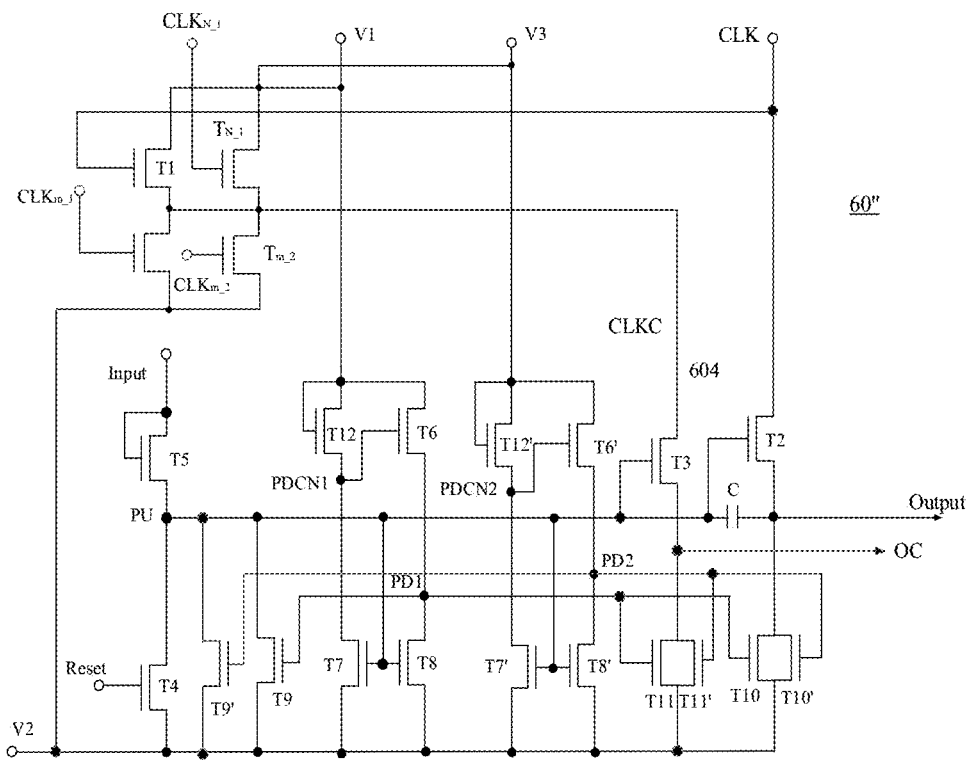
FIG. 6C is another example circuit diagram of a shift register unit according to embodiments of the present disclosure.

FIG. 6C is another example circuit diagram of a shift register unit according to embodiments of the present disclosure. As shown in FIG. 6C, unlike the embodiments shown in FIGS. 6A and 6B, the output control circuit in the shift register unit 60" may further include a second pull-down control sub-circuit coupled to the third voltage terminal V3. The second pull-down control sub-circuit has substantially the same circuit structure as the first pull-down control sub-circuit. For example, the second pull-down control sub-circuit may include a transistor T6', a transistor T7', a transistor T8', a transistor T9', a transistor T10', a transistor T11', and a transistor T12'.

In the circuit configuration shown in FIG. 6C, the first pull-down control node PD1 and the second pull-down control node PD2 are alternately controlled, by alternately responding to the first voltage signal V1 and the third voltage signal V3, to reduce noises at the pull-up control node PU, the first signal output terminal OUTPUT, and the second signal output terminal OC of the shift register unit, thereby further improving reliability of the shift register unit.

Figure 6D:
FIG. 6D is a waveform diagram of voltage signals in the shift register unit in FIG. 6C.
Figure 6D:
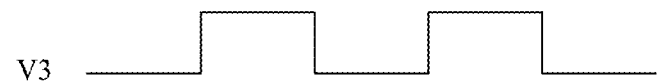

According to an embodiment of the present disclosure, voltage signal waveforms of the first voltage signal V1 and the third voltage signal V3 are as shown in FIG. 6D. That is, one of the first voltage signal V1 and the third voltage signal V3 is always at an active level. Therefore, the first pull-down control sub-circuit and the second pull-down control sub-circuit alternately operate, for example, in a period of about 2 seconds, the first pull-down control sub-circuit operates, and within a period of 2 seconds thereafter, the second pull-down control sub-circuit operates. Since the first pull-down control sub-circuit and the second pull-down control sub-circuit have substantially the same circuit structure, the operation of the shift register unit when the first voltage signal V1 is at an active level (for example, a high level) is the same as the operation of the shift register unit when the third voltage signal V3 is at an active level according to an embodiment of the present disclosure. According to an embodiment of the present disclosure, it is only necessary to make both the first voltage terminal V1 and the third voltage terminal V3 connected to the first electrode of the transistors in the first transistor group in the clock control circuit.

All of the transistors in the above embodiments are N-type thin film transistors. Alternatively, all of the above transistors may be P-type thin film transistors.

Figure 7:
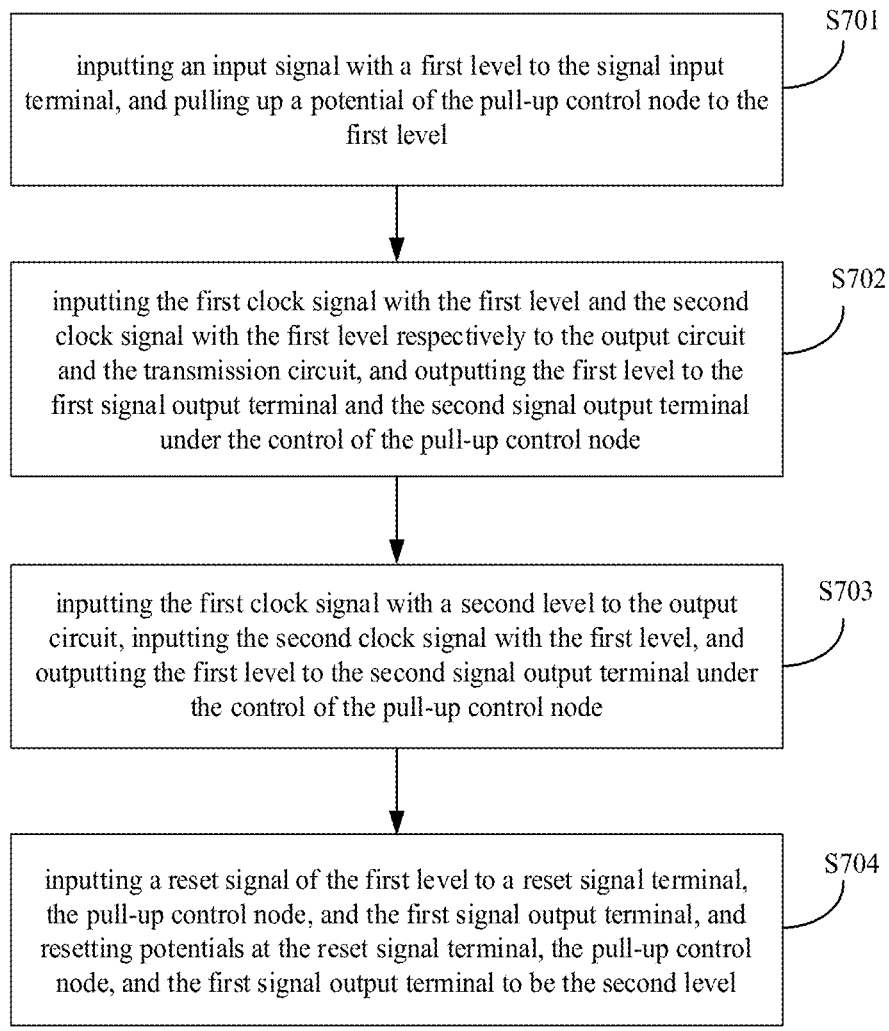
FIG. 7 is a flow chart of a method for driving a shift register unit according to embodiments of the present disclosure.

According to embodiments of the present disclosure, a method for driving a shift register unit is further provided, which may be applied to the shift register unit according to any of the above embodiments of the present disclosure. It should be noted that serial numbers of steps in the following methods are only as a representation of the steps for description, and should not be regarded as indicating an execution order of the steps. This method does not need to be performed exactly as shown, unless explicitly stated. FIG. 7 is a flow chart of a method for driving a shift register unit according to embodiments of the present disclosure. As shown in FIG. 7, the method 70 for driving the shift register unit according to an embodiment of the present disclosure may include the following steps:

step S701, in a first period, inputting an input signal with a first level to the signal input terminal, and pulling up a potential of the pull-up control node to the first level;

step S702, in a second period, inputting the first clock signal with the first level and the second clock signal with the first level respectively to the output circuit and the transmission circuit, and outputting the first level to the first signal output terminal and the second signal output terminal under the control of the pull-up control node;

step S703, in a third period, inputting the first clock signal with a second level to the output circuit, inputting the second clock signal with the first level, and outputting the first level to the second signal output terminal under the control of the pull-up control node; and step S704, in a fourth period, inputting a reset signal of the first level to a reset signal terminal, the pull-up control node, and the first signal output terminal, and resetting potentials at the reset signal terminal, the pull-up control node, and the first signal output terminal to be the second level.

According to an embodiment of the present disclosure, the second clock signal may be generated using a first clock signal and at least one additional clock signal. The first clock signal and the at least one additional clock signal may have the same period and different phases from each other. A period of the second clock signal is the same as a period of the first clock signal, and a pulse width of the second clock signal is larger than a pulse width of the first clock signal. Additionally, a duration of a high level of the first clock signal does not overlap a duration of a high level of the at least one additional clock signal provided to the second transistor group.

According to an embodiment of the present disclosure, as described above, the clock control circuit may include a first transistor group and a second transistor group. The driving method may further include: providing the first clock signal to a transistor in the first transistor group, providing at least one additional clock signal to a transistor in the second transistor group, and generating the second clock signal by the clock control circuit, where a duration of an active level of the first clock signal provided to the transistor in the first transistor group does not overlap with a duration of an active level of the at least one additional clock signal provided to the transistor in the second transistor group, and a pulse width of the second clock signal is determined by a minimum of a phase difference between the first clock signal and the at least one additional clock signal provided to the transistor in the second transistor group.

According to an embodiment of the present disclosure, the driving method may include: providing the first clock signal and at least one additional clock signal to transistors in the first transistor group, providing a plurality of additional clock signals to transistors in the second transistor group, and generating the second clock signal by the clock control circuit, where durations of active levels of the first clock signal and the at least one additional clock signal provided to the transistors in the first transistor group do not overlap with durations of active levels of the plurality of additional clock signals provided to the transistors in the second transistor group, and a pulse width of the second clock signal is determined by a minimum of phase differences between the first clock signal and the plurality of additional clock signals provided to the transistors in the second transistor group.

Figure 8:
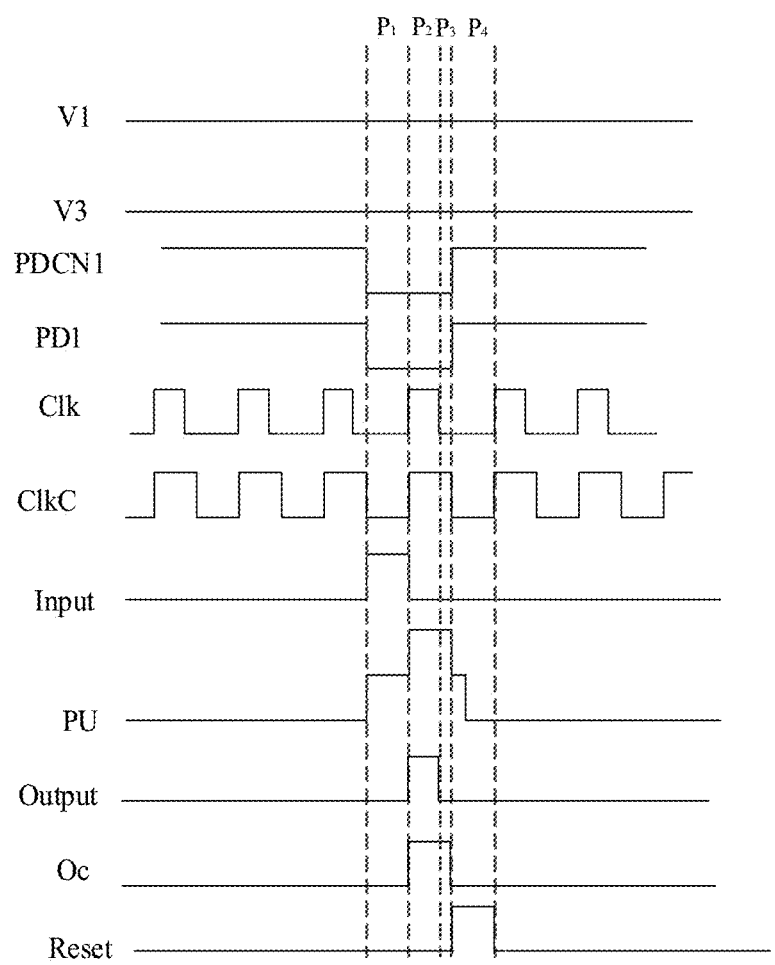
FIG. 8 is a timing diagram of signals in a shift register unit according to embodiments of the present disclosure.

FIG. 8 is an operational timing diagram of a shift register unit according to embodiments of the present disclosure. The operation of the shift register unit according to an embodiment of the present disclosure will be described below in detail with reference to FIGS. 6A, 6B, 6C, 6D, 7, and 8. For convenience of description, description is made by taking an example that the first level is a high level and the second level is a low level. In addition, the following embodiment is described by taking an example that the first pull-down control sub-circuit in the output control circuit is in operation and the second pull-down control sub-circuit is not in operation, that is, the first voltage signal V1 is a high-level direct current (DC) signal, and the third voltage signal V3 is a low-level DC signal. A person of ordinary skill in the art may appreciate that the operation in this situation substantially corresponds to the operation of shift register unit 60 in FIG. 6A.

As shown in FIG. 8, during the P1 period, the input signal Input is at a high level, the fifth transistor T5 is turned on, and a voltage of the pull-up control node PU starts to rise, to charge the capacitor C. Since the pull-up control node PU is at a high level, the seventh transistor T7 and the eighth transistor T8 are turned on, and the low-level second voltage signal V2 is transmitted to the node PDCN1 and the pull-down control node PD1 through the turned-on first transistor T7 and eighth transistor T8, respectively. Meanwhile, since the pull-up control node PU is at a high level, the second transistor T2 and the third transistor T3 are turned on, and the first clock signal Clk and the second clock signal ClkC are respectively transmitted to the first signal output terminal OUTPUT and the second signal output terminal OC. Since the first clock signal Clk and the second clock signal ClkC are both at a low level at this time, the first output signal Output outputted by the first signal output terminal OUTPUT and the second output signal OC outputted by the second signal output terminal OC are also at a low level.

During the P2 period, the first clock signal Clk and the second clock signal ClkC are each at a high level. The input signal Input is at a low level, and the fifth transistor T5 is turned off. Since a bootstrap action of the capacitor C causes the pull-up control node PU to bootstrap to a higher potential, the second transistor T2 and the third transistor T3 are continuously turned on, and the first clock signal Clk and the second clock signal ClkC are respectively transmitted to the first signal output terminal OUTPUT and the second signal output terminal OC. Since the first clock signal Clk and the second clock signal ClkC are both at a high level at this time, the first output signal Output from the first signal output terminal OUTPUT and the second output signal OC from the second signal output terminal OC are each at a high level. The shift register unit outputs the first output signal Output of a high level as a signal for driving a current stage of gate electrode.

During the P3 period, the input signal Input is at a low level, and the potential of the pull-up control node PU begins to decrease. With the capacitive coupling and bootstrap action, the pull-up control node PU further remains at a high potential, and the second transistor T2 and the third transistor T3 are turned on. At this time, under the control of the first voltage signal V1, the potentials of the pull-down control node PD1 and the node PDCN1 starts to be pulled up. Since the first clock signal Clk is at a low level, the first output signal Output turns to a low level, and the first output signal Output with a steep falling edge (i.e., reducing falling time) can be provided. The second clock signal ClkC provided by the transmission circuit according to the embodiment of the present disclosure is at a high level, and thus the second display signal OC is maintained at a high level.

During the P4 period, the reset signal Reset is at a high level, and the fourth transistor T4 is turned on, so as to reset the pull-up node PU to a low level. Under the control of the first voltage signal V1, the pull-down control node PD1 and the node PDCN1 are at a high level.

Thereafter, although the reset signal Reset turns to a low level, the ninth transistor T9, the tenth transistor T10, and the eleventh transistor T11 are turned on, since the pull-down control node PD1 is at a high level. Therefore, a low-level voltage signal V2 is transmitted to the pull-up control node PU, the second signal output terminal OC and the first signal output terminal OUTPUT through the ninth transistor T9, the tenth transistor T10 and the eleventh transistor T11, respectively, and noises at the pull-up control node PU, the second signal output terminal OC and the first signal output terminal OUTPUT are persistently reduced. That is, a signal from the pull-up control node PU and output signals of the second signal output terminal OC and the first signal output terminal OUTPUT are each at a low level.

It should be noted that, the output control circuit in an example embodiment as shown in FIG. 6C further includes a second pull-down sub-circuit, and the working principle of the shift register unit when the high-level third voltage signal V3 is applied is the same as the working principle of the shift register unit when the high-level first voltage signal V1 is applied, which is not described in detail herein for concise.

In addition, a person of ordinary skill in the art can understand that the shift register unit may further include a general reset circuit configured to provide a general reset signal, which is at a high level before the P1 period, and the general reset circuit is configured to further reset a level at the pull-up control node PU, a level at the first signal output terminal, and a level at the second signal output terminal. For example, the general reset signal is set to be a high level before each frame of image is displayed. The STV signal may be used as the general reset signal. For the sake of concise, it will not be repeated herein.

A gate drive circuitry is further provided according to embodiments of the present disclosure. The gate drive circuitry according to an embodiment of the present disclosure may include R stages of shift register units, and a structure of each of the R stages of shift register units may refer to any of the above embodiments. An r-th stage of shift register unit is coupled to N+1 clock signal lines of a first clock signal line to a Q-th clock signal line, R is an integer greater than or equal to Q, r is an integer that is greater than or equal to 1, and less than or equal to R, and Q is the number of the plurality of clock signal lines in the gate drive circuitry, Q being greater than N.

According to an optional embodiment of the present disclosure, the r-th stage of shift register unit is provided with the first clock signal and the N additional clock signals respectively through the N+1 clock signal lines.

Figure 9A:
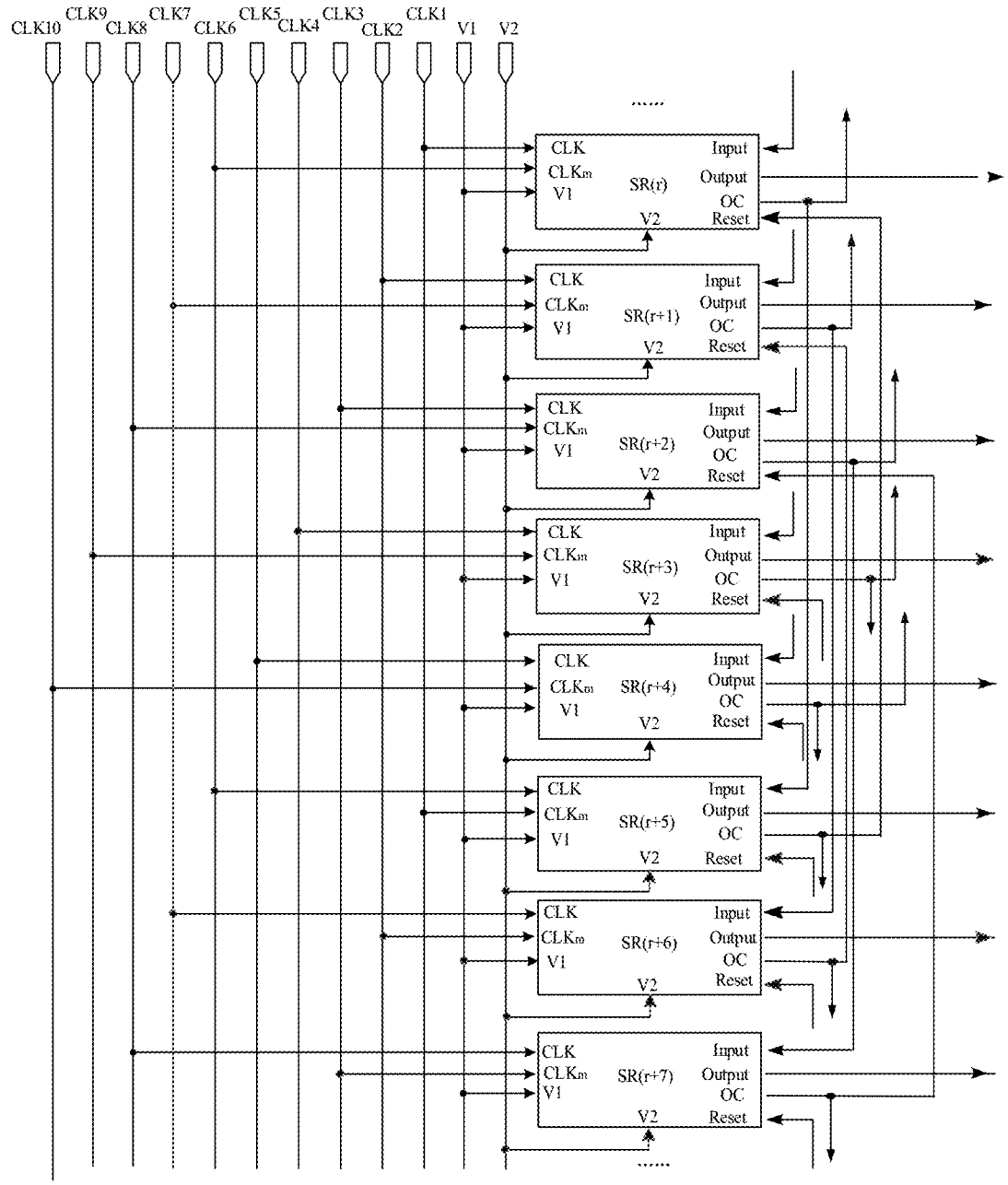
FIG. 9A is an example cascading manner of shift register units in a gate drive circuitry according to embodiments of the present disclosure.
Figure 9B:
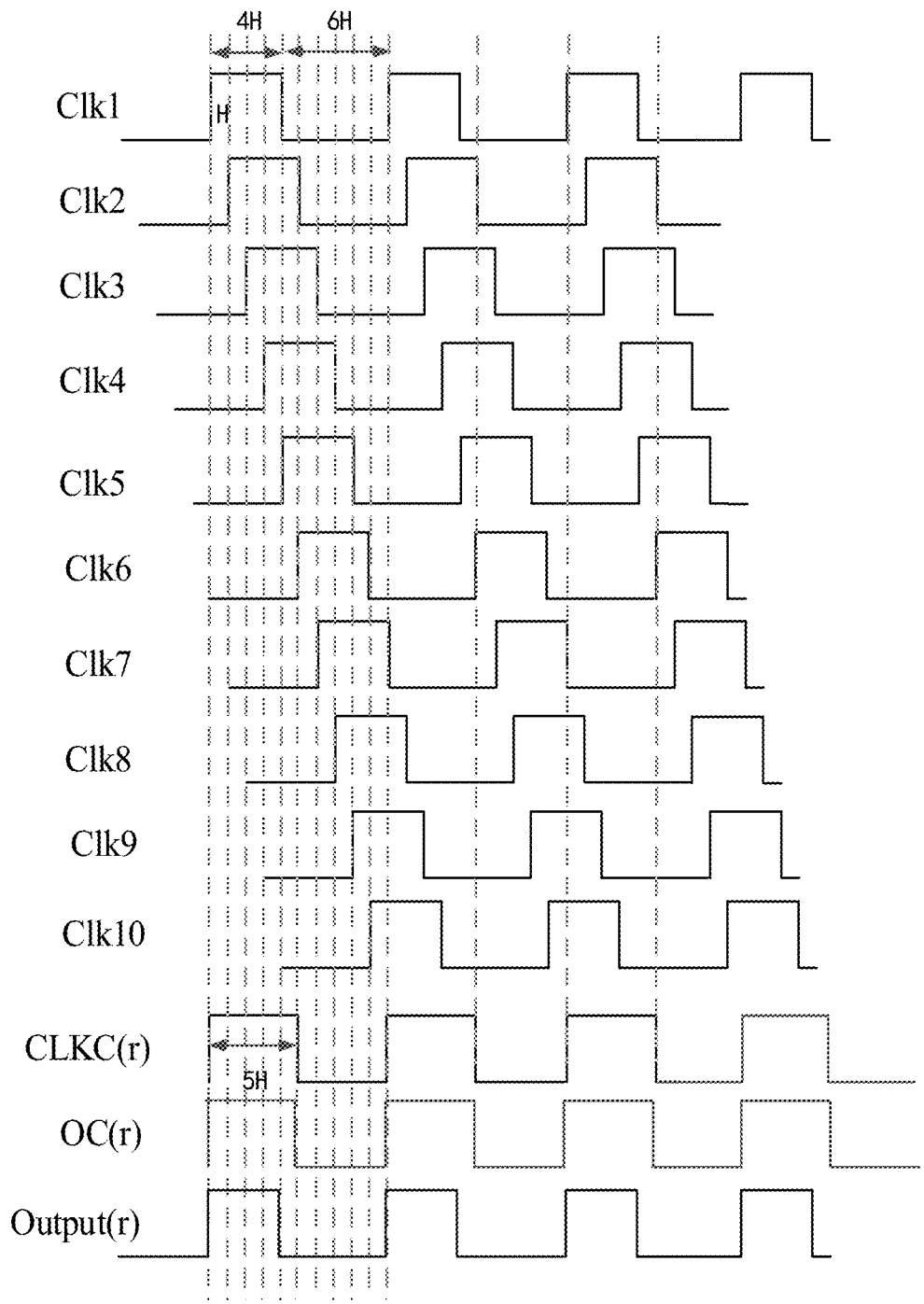
FIG. 9B is a waveform diagram of clock signals used in an example gate drive circuitry according to embodiments of the present disclosure.

FIG. 9A shows an example gate drive circuitry according to embodiments of the present disclosure. For convenience of description, each of the shift register units in FIG. 9A has the circuit structure shown in FIG. 6A as an example for description. That is, an additional clock signal $Clk_m$ is supplied to the shift register unit. Ten clock signals Clk1 to Clk10 are used in the embodiment of FIG. 9A, and FIG. 9B shows waveform diagrams of the clock signals Clk1 to Clk10. That is, in the embodiments, the number Q of the clock signal lines is equal to 10. In the embodiment of FIG. 9A, first clock signal terminals CLK of the r-th stage of shift register unit SR(r) to the (r+9)-th stage of shift register unit SR(r+9) are sequentially coupled to the clock signal lines CLK1 to CLK10, and clock signals Clk1 to Clk10 are supplied to the clock signal lines CLK1 to CLK10, respectively. Taking the r-th stage of shift register SR(r) as an example, the first signal output terminal OUTPUT of the r-th stage of shift register unit SR(r) may be coupled to, for example, an r-th row of gate line of a display panel. The first output signal Output may be used as a gate driving signal for the gate line in a corresponding row. The second signal output terminal OC of the r-th stage of shift register unit SR(r) may be coupled to the signal input terminal Input of the (r+5)-th stage of shift register unit SR(r+5), and thus the second output signal OC of the r-th stage of shift register unit SR(r) is used as an input signal of the (r+5)-th stage of shift register unit SR(r+5). The second signal output terminal OC of the r-th stage of shift register unit SR(r) may also be coupled to the reset signal terminal Reset of the (r−5)-th stage of shift register unit SR(r−5), and thus the second output signal OC of the r-th stage of shift register unit SR(r) is used as the reset signal Reset of the (r−5)-th stage of shift register unit SR(r−5).

In the embodiment of FIG. 9A, the clock signal line CLK1 is coupled to the first clock signal terminal CLK of the r-th stage of shift register unit, to supply the clock signal Clk1 to the first clock signal terminal CLK of the r-th stage of shift register unit. Further, the clock signal line CLK6 is coupled to the clock signal terminal $CLK_m$ of the r-th stage of shift register unit, to supply the clock signal Clk6 to the clock signal terminal $CLK_m$ of the r-th stage of shift register unit, that is, the clock signal Clk6 is used as an additional clock signal $Clk_m$ for the r-th stage of shift register unit. The clock signal line CLK2 is coupled to the first clock signal terminal CLK of the (r+1)-th stage of shift register unit, to supply the clock signal Clk2 to the first clock signal terminal CLK of the (r+1)-th stage of shift register unit. Further, the clock signal line CLK7 is coupled to the clock signal terminal $CLK_m$ of the (r+1)-th stage of shift register unit, to supply the clock signal Clk7 to the clock signal terminal $CLK_m$ of the (r+1)-th stage of shift register unit, that is, the clock signal Clk7 is used as an additional clock signal $Clk_m$ for the (r+1)-th stage of shift register unit. In a similar fashion, the clock signal line CLK10 is coupled to the first clock signal terminal CLK of the (r+9)-th stage of shift register unit, to supply the clock signal Clk10 to the first clock signal terminal CLK of the (r+9)-th stage of shift register unit. Further, the clock signal line CLK5 is coupled to the clock signal terminal $CLK_m$ of the (r+9)-th stage of shift register unit, to supply the clock signal Clk5 to the clock signal terminal $CLK_m$ of the (r+9)-th stage of shift register unit, that is, the clock signal Clk5 is used as an additional clock signal $Clk_m$ for the (r+9)-th stage of shift register unit. A person of ordinary skill in the art may understand that the (r+10)-th stage of shift register unit and the r-th stage of shift register unit have a same connection relationship, and the (r+11)-th stage of shift register unit and the (r+1)-th stage of shift register unit have a same connection relationship, and so on.

As shown in FIG. 9B, the clock signals Clk1 to Clk10 have a same clock cycle and different timing sequences from each other. For convenience of description, one clock period Tc of the clock signals Clk1 to Clk10 is divided into 10 parts (10 H). In the embodiment of FIG. 9B, the high-level period of each of the clock signals Clk1 to Clk10 has a duration of 4 H, the low-level period of each of the clock signals Clk1 to Clk10 has a duration of 6 H, and the pulse width of each of the clock signals Clk1 to Clk10 is 4 H as a high level is an active level for each stage of shift register unit. Taking the r-th stage of shift register unit SR(r) as an example, Clk1 is supplied to the first clock signal of SR(r), and the first output signal Output(r) outputted by the first signal output terminal OUTPUT has the same waveform as the clock signal Clk1, thus the first output signal Output(r) has a pulse width of 4 H. The pulse width of the second clock signal ClkC(r) outputted by the clock control circuit of SR(r) to the transmission circuit is 5 H, and the second output signal OC(r) outputted by the second signal output terminal OC of SR(r) has the same waveform as the second clock signal ClkC(r), thus the second output signal OC(r) has a pulse width of 5H.

The second output signal OC(r) is used as an input signal of the (r+5)-th stage of shift register unit SR(r+5), which can extend the charging time of the pull-up control node of the shift register unit SR(r+5). Thus, there is no need to set additional clock signal lines to provide additional clock signals.

FIG. 9A schematically shows only the case of providing one additional clock signal to each shift register unit, and a person of ordinary skill in the art may appreciate that more additional clock signals can be provided to each shift register unit to obtain the second output signal with a more stable waveform. Taking SR(r) as an example, SR(r) may also be coupled to the clock signal line CLK2, thereby supplying the clock signal Clk2 to the shift register unit SR(r) for use as the additional clock signal $Clk_{N\_1}$ supplied to a clock control circuit in SR(r). It is also possible to connect SR(r) to the clock signal line CLK7, to supply the clock signal Clk7 to the shift register unit SR(r) for use as an additional clock signal $Clk_{m\_2}$ supplied to the clock control circuit in SR(r).

Moreover, a person of ordinary skill in the art may appreciate that although the above embodiments are described by taking 10 clock signals as an example, cases of using the other number of clocks can also be applied to embodiments of the present disclosure, as long as these clocks have the same period, and phases of these clocks are different from each other. A person of ordinary skill in the art may appreciate that multiple clock signals as an example shown in FIG. 9B may have other waveforms and timings.

Figure 9C:
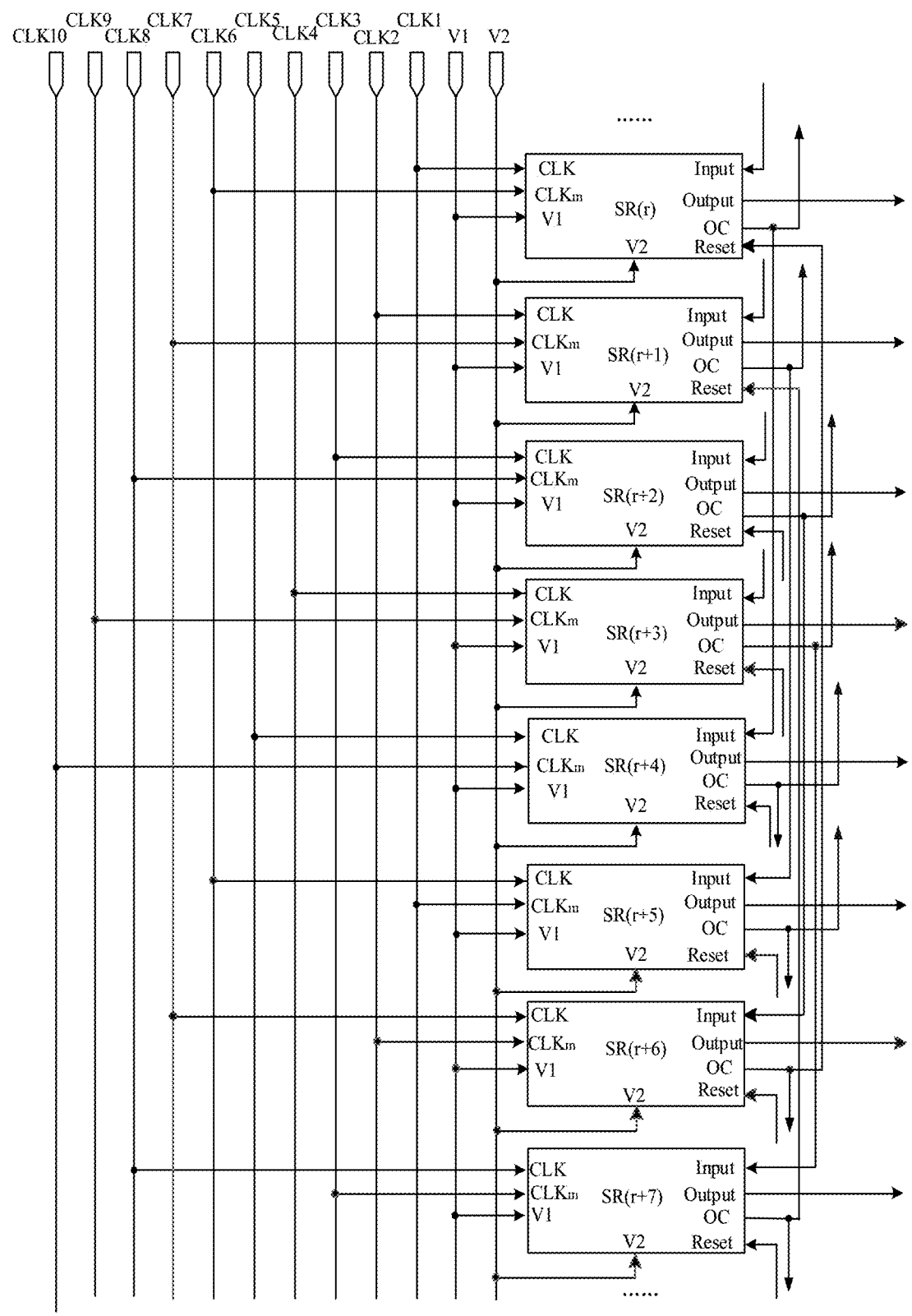
FIG. 9C is another example cascading manner of shift register units in a gate drive circuitry according to embodiments of the present disclosure.

A person of ordinary skill in the art may appreciate that the cascading relation in FIG. 9A is merely an example, and the gate drive circuitry according to an embodiment of the present disclosure may also have other cascading manners. FIG. 9C shows another example cascading manner of a shift register unit in a gate drive circuitry according to embodiments of the present disclosure. As shown in FIG. 9C, the difference from the embodiment of FIG. 9A lies in that, taking the r-th stage of shift register unit SR(r) as an example, the second signal output terminal OC may be coupled to the signal input terminal Input of the (r+4)-th stage of shift register unit SR(r+4), thereby the second output signal OC of the r-th stage of shift register unit SR(r) is used as an input signal of the (r+4)-th stage of shift register unit SR(r+4); and the second signal output terminal OC of the r-th stage of shift register unit SR(r) may also be coupled to the reset signal terminal Reset of the (r−6)-th stage of shift register unit SR(r−6), thereby the second output signal OC of the r-th stage of shift register unit SR(r) is used as a reset signal of the (r−6)-th stage of shift register unit SR(r−6). A person of ordinary skill in the art may appreciate that other cascading manners of the shift register unit is also possible, and will not be described again for brevity.

Figure 10:
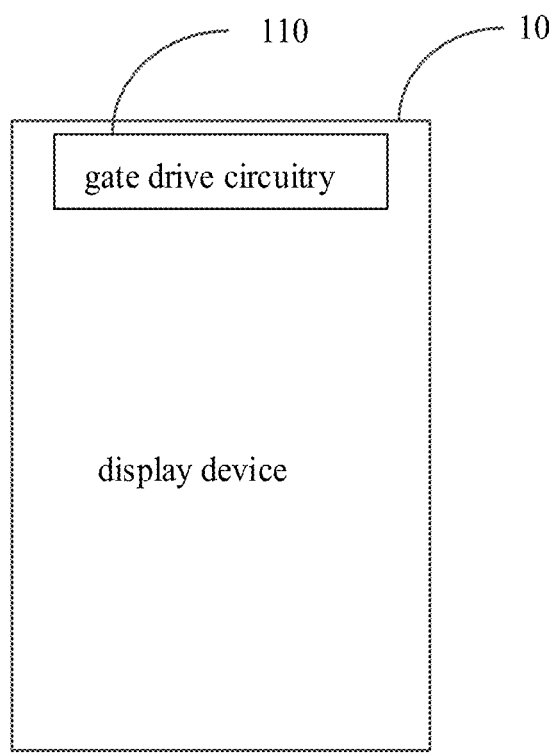
FIG. 10 is a schematic block diagram of a display device according to embodiments of the present disclosure.

FIG. 10 shows a schematic block diagram of a display device according to embodiments of the present disclosure. As shown in FIG. 10, the display device 10 may include a gate drive circuitry 110 according to any one of the above embodiments of the present disclosure. The display device 10 according to an embodiment of the present disclosure may be any product or component having a display function such as an electronic paper, a mobile phone, a tablet computer, a television, a display, a notebook computer, a digital photo frame, a navigator, or the like.

The above embodiments are merely used to further describe the objectives, the technical solutions, and the beneficial effects of the embodiments of the present disclosure. It is understandable that the above embodiments are merely optional embodiments of the present disclosure and are not intended to limit the scope of the present disclosure. Any modification, substitutions, or improvements made by a person of ordinary skill in the art without departing from the principle of the present disclosure shall fall within the scope of the present disclosure.

What is claimed is:

1. A shift register unit, comprising:
   an output circuit, coupled to a first signal output terminal and a pull-up control node, wherein the output circuit is configured to receive a first clock signal, and output the first clock signal to the first signal output terminal under a control of a potential of the pull-up control node;
   an output control circuit, coupled to a signal input terminal, the pull-up control node, and the first signal output terminal, wherein the output control circuit is configured to receive an input signal from the signal input terminal, and control, in response to the input signal, the potential of the pull-up control node and a potential of the first signal output terminal;
   a clock control circuit, configured to receive the first clock signal and at least one additional clock signal, and generate a second clock signal using the first clock signal and the at least one additional clock signal; and
   a transmission circuit, coupled to a second signal output terminal and the pull-up control node, wherein the transmission circuit is configured to receive the second clock signal, and output the second clock signal to the second signal output terminal under a control of the potential of the pull-up control node,
   wherein the clock control circuit is configured in that a period of the second clock signal is the same as a period of the first clock signal, and a pulse width of the second clock signal is larger than a pulse width of the first clock signal.

2. The shift register unit according to claim 1, wherein the clock control circuit comprises:
   a first transistor group comprising a first transistor, wherein a gate electrode of the first transistor is used to receive the first clock signal, a first electrode of the first transistor is coupled to a first voltage terminal, and a second electrode of the first transistor is coupled to the transmission circuit; and
   a second transistor group comprising m transistors, wherein a first electrode of each of the m transistors is coupled to a second voltage terminal, a second electrode of each of the m transistors is coupled to the transmission circuit, and gate electrodes of the m transistors are respectively used to receive the at least one additional clock signal, m being an integer greater than or equal to 1.

3. The shift register unit according to claim 2, wherein the at least one additional clock signal comprises N additional clock signals, N being an integer greater than m;
the first transistor group further comprises N-m transistors, a first electrode of each of the N-m transistors is coupled to the first voltage terminal, a second electrode of each of the N-m transistors is coupled to the transmission circuit, and gate electrodes of the N-m transistors are respectively used to receive N-m additional clock signals of the N additional clock signals; and
the m transistors in the second transistor group are respectively used to receive m additional clock signals of the N additional clock signals except the N-m additional clock signals.

4. The shift register unit according to claim 1, wherein the output circuit comprises a second transistor and a capacitor;
a gate electrode of the second transistor is coupled to the pull-up control node, a first electrode of the second transistor is used to receive the first clock signal, and a second electrode of the second transistor is coupled to the first signal output terminal; and
a first end of the capacitor is coupled to the gate electrode of the second transistor, and a second end of the capacitor is coupled to the first signal output terminal.

5. The shift register unit according to claim 1, wherein the transmission circuit comprises a third transistor;
a gate electrode of the third transistor is coupled to the pull-up control node, a first electrode of the third transistor is used to receive the second clock signal, and a second electrode of the third transistor is coupled to the second signal output terminal.

6. The shift register unit according to claim 1, wherein the output control circuit comprises a fourth transistor;
a gate electrode and a first electrode of the fourth transistor are coupled to the signal input terminal, a second electrode of the fourth transistor is coupled to the pull-up control node, and the fourth transistor is configured to transmit the input signal at the signal input terminal to the pull-up control node, to charge the pull-up control node.

7. The shift register unit according to claim 1, wherein the second signal output terminal of a current shift register unit is coupled to a signal input terminal of a subsequent stage of shift register unit; and
the transmission circuit of the current shift register unit is configured to transmit the second clock signal at the second signal output terminal to the signal input terminal of the subsequent stage of shift register unit as an input signal of the subsequent stage of shift register unit.

8. The shift register unit according to claim 1, wherein the output control circuit is further coupled to a reset signal terminal, and is configured to reset a potential at the pull-up control node, in response to a reset signal received from the reset signal terminal.

9. The shift register unit according to claim 2, wherein a duration of an active level of the first clock signal and a duration of an active level of the at least one additional clock signal provided to the second transistor group are non-overlapped; and
the clock control circuit is configured to generate the second clock signal with a pulse width that is determined by a minimum of a phase difference between the first clock signal and the at least one additional clock signal provided to the second transistor group.

10. A gate drive circuitry, comprising:
a plurality of clock signal lines; and
R stages of shift register units;
wherein each of the R stages of shift register units comprises:
an output circuit, coupled to a first signal output terminal and a pull-up control node, wherein the output circuit is configured to receive a first clock signal, and output the first clock signal to the first signal output terminal under a control of a potential of the pull-up control node;
an output control circuit, coupled to a signal input terminal, the pull-up control node, and the first signal output terminal, wherein the output control circuit is configured to receive an input signal from the signal input terminal, and control, in response to the input signal, the potential of the pull-up control node and a potential of the first signal output terminal;
a clock control circuit, configured to receive the first clock signal and at least one additional clock signal, and generate a second clock signal using the first clock signal and the at least one additional clock signal; and
a transmission circuit, coupled to a second signal output terminal and the pull-up control node, wherein the transmission circuit is configured to receive the second clock signal, and output the second clock signal to the second signal output terminal under a control of the potential of the pull-up control node,
wherein the clock control circuit is configured in that a period of the second clock signal is the same as a period of the first clock signal, and a pulse width of the second clock signal is larger than a pulse width of the first clock signal, and
wherein an r-th stage of shift register unit is coupled to N+1 clock signal lines of a first clock signal line to a Q-th clock signal line, R is an integer greater than or equal to Q, r is an integer that is greater than or equal to 1, and less than or equal to R, and Q is the number of the plurality of clock signal lines in the gate drive circuitry, Q being greater than N.

11. The gate drive circuitry according to claim 10, wherein the r-th stage of shift register unit is provided with the first clock signal and the N additional clock signals respectively through the N+1 clock signal lines.

12. The gate drive circuitry according to claim 10, wherein the clock control circuit comprises:
a first transistor group comprising a first transistor, wherein a gate electrode of the first transistor is used to receive the first clock signal, a first electrode of the first transistor is coupled to a first voltage terminal, and a second electrode of the first transistor is coupled to the transmission circuit; and
a second transistor group comprising m transistors, wherein a first electrode of each of the m transistors is coupled to a second voltage terminal, a second electrode of each of the m transistors is coupled to the transmission circuit, and gate electrodes of the m transistors are respectively used to receive the at least one additional clock signal, m being an integer greater than or equal to 1.

13. The gate drive circuitry according to claim 12, wherein the at least one additional clock signal comprises N additional clock signals, N being an integer greater than m;
the first transistor group further comprises N-m transistors, a first electrode of each of the N-m transistors is coupled to the first voltage terminal, a second electrode of each of the N-m transistors is coupled to the transmission circuit, and gate electrodes of the N-m transistors are respectively used to receive N-m additional clock signals of the N additional clock signals; and the m transistors in the second transistor group are respectively used to receive m additional clock signals of the N additional clock signals except the N-m additional clock signals.

14. The gate drive circuitry according to claim 10, wherein a second signal output terminal of the r-th stage of shift register unit is coupled to a signal input terminal of the (r+x)-th stage of shift register unit, x being a positive integer; and a transmission circuit of the r-th stage of shift register unit is configured to transmit a second clock signal at the second signal output terminal to the signal input terminal of the (r+x)-th stage of shift register unit as an input signal of the (r+x)-th stage of shift register unit.

15. A display device, comprising the gate drive circuitry according to claim 10.

16. A method for driving a shift register unit, wherein the shift register unit comprises:

an output circuit, coupled to a first signal output terminal and a pull-up control node, wherein the output circuit is configured to receive a first clock signal, and output the first clock signal to the first signal output terminal under a control of a potential of the pull-up control node;

an output control circuit, coupled to a signal input terminal, the pull-up control node, and the first signal output terminal, wherein the output control circuit is configured to receive an input signal from the signal input terminal, and control, in response to the input signal, the potential of the pull-up control node and a potential of the first signal output terminal;

a clock control circuit, configured to receive the first clock signal and at least one additional clock signal, and generate a second clock signal using the first clock signal and the at least one additional clock signal, and a transmission circuit, coupled to a second signal output terminal and the pull-up control node, wherein the transmission circuit is configured to receive the second clock signal, and output the second clock signal to the second signal output terminal under a control of the potential of the pull-up control node, wherein the clock control circuit is configured in that a period of the second clock signal is the same as a period of the first clock signal, and a pulse width of the second clock signal is larger than a pulse width of the first clock signal, wherein the method for driving the shift register unit comprises:

in a first period, inputting the input signal with a first level to the signal input terminal, and pulling up a potential of the pull-up control node to the first level;

in a second period, inputting the first clock signal with the first level and the second clock signal with the first level respectively to the output circuit and the transmission circuit, and outputting the first level to the first signal output terminal and the second signal output terminal under the control of the pull-up control node; and in a third period, inputting the first clock signal with a second level to the output circuit, inputting the second clock signal with the first level, and outputting the first level to the second signal output terminal under the control of the pull-up control node.

17. The method according to claim 16, further comprising:

in a fourth period, inputting a reset signal of the first level to a reset signal terminal, the pull-up control node, and the first signal output terminal, and resetting potentials at the reset signal terminal, the pull-up control node, and the first signal output terminal to be the second level.

18. The method according to claim 16, further comprising:

generating the second clock signal by using the first clock signal and the at least one additional clock signal, wherein a period of the first clock signal is different from a period of the at least one additional clock signal, and a phase of the first clock signal is different from a phase of the at least one additional clock signal.

19. The method according to claim 18, wherein the clock control circuit comprises a first transistor group and a second transistor group; and the method comprises:

providing the first clock signal to a transistor in the first transistor group, providing the at least one additional clock signal to a transistor in the second transistor group, and generating the second clock signal by the clock control circuit, wherein a duration of an active level of the first clock signal provided to the transistor in the first transistor group does not overlap with a duration of an active level of the at least one additional clock signal provided to the transistor in the second transistor group, and a pulse width of the second clock signal is determined by a minimum of a phase difference between the first clock signal and the at least one additional clock signal provided to the transistor in the second transistor group.

20. The method according to claim 18, wherein the clock control circuit comprises a first transistor group and a second transistor group; and the method comprises:

providing the first clock signal and the at least one additional clock signal to transistors in the first transistor group, providing a plurality of additional clock signals to transistors in the second transistor group, and generating the second clock signal by the clock control circuit, wherein a duration of active levels of the first clock signal and the at least one additional clock signal provided to the transistors in the first transistor group does not overlap with a duration of an active level of the plurality of additional clock signals provided to the transistors in the second transistor group, and a pulse width of the second clock signal is determined by a minimum of phase differences between the first clock signal and the plurality of additional clock signals provided to the transistors in the second transistor group.

* * * * *